(12) United States Patent
Hara

(10) Patent No.: US 11,097,426 B2
(45) Date of Patent: Aug. 24, 2021

(54) CARRIER SYSTEM, EXPOSURE APPARATUS, CARRIER METHOD, EXPOSURE METHOD, DEVICE MANUFACTURING METHOD, AND SUCTION DEVICE

(71) Applicant: NIKON CORPORATION, Tokyo (JP)

(72) Inventor: Hideaki Hara, Kumagaya (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 16/925,386

(22) Filed: Jul. 10, 2020

(65) Prior Publication Data

US 2020/0338747 A1 Oct. 29, 2020

Related U.S. Application Data

(60) Continuation of application No. 16/446,979, filed on Jun. 20, 2019, now Pat. No. 10,744,648, which is a division of application No. 15/974,965, filed on May 9, 2018, now Pat. No. 10,384,350, which is a division of application No. 15/637,069, filed on Jun. 29, 2017, now Pat. No. 10,081,108, which is a division of application No. 14/648,280, filed as application No.
(Continued)

(51) Int. Cl.
| | |
|---|---|
| *B25J 11/00* | (2006.01) |
| *G03F 7/20* | (2006.01) |
| *H01L 21/67* | (2006.01) |
| *H01L 21/68* | (2006.01) |
| *H01L 21/683* | (2006.01) |
| *H01L 21/687* | (2006.01) |
| *B25J 15/06* | (2006.01) |

(52) U.S. Cl.
CPC ....... *B25J 11/0095* (2013.01); *B25J 15/0616* (2013.01); *G03F 7/7075* (2013.01); *G03F 7/70716* (2013.01); *G03F 7/70783* (2013.01); *H01L 21/67259* (2013.01); *H01L 21/67288* (2013.01); *H01L 21/681* (2013.01); *H01L 21/6838* (2013.01); *H01L 21/68778* (2013.01)

(58) Field of Classification Search
CPC ............ G10K 11/17857; B25J 11/0095; G03F 7/7075; G03F 7/70783; G03F 7/70716
USPC ................... 355/52, 53, 55, 72–76
See application file for complete search history.

(56) References Cited

U.S. PATENT DOCUMENTS

| | | | |
|---|---|---|---|
| 4,391,511 A | 7/1983 | Akiyama et al. | |
| 4,465,368 A | 8/1984 | Matsuura et al. | |
| (Continued) | | | |

FOREIGN PATENT DOCUMENTS

| | | |
|---|---|---|
| CN | 101036221 A | 9/2007 |
| CN | 101047141 A | 10/2007 |
| (Continued) | | |

OTHER PUBLICATIONS

Jan. 28, 2014 International Search Report issued in International Patent Application No. PCT/JP2013/081852.
(Continued)

*Primary Examiner* — Hung Nguyen
(74) *Attorney, Agent, or Firm* — Oliff PLC

(57) ABSTRACT

A carrier system and method carries a plate-like object to an object mounting section. The system imparts vibration to the object that has been moved such that the object is vibrating when the object is placed onto the mounting section.

30 Claims, 11 Drawing Sheets

Related U.S. Application Data

PCT/JP2013/081852 on Nov. 27, 2013, now Pat. No. 9,821,469.

(60) Provisional application No. 61/731,892, filed on Nov. 30, 2012.

(56) References Cited

U.S. PATENT DOCUMENTS

| | | | |
|---|---|---|---|
| 4,593,168 | A | 6/1986 | Amada |
| 5,969,441 | A | 10/1999 | Loopstra et al. |
| 6,208,407 | B1 | 3/2001 | Loopstra |
| 6,590,634 | B1 | 7/2003 | Nishi et al. |
| 6,611,316 | B2 | 8/2003 | Sewell |
| 6,624,433 | B2 | 9/2003 | Okumura et al. |
| 7,230,682 | B2 | 6/2007 | Shimizu et al. |
| 7,643,130 | B2 | 1/2010 | Yoshitake et al. |
| 7,955,074 | B2 | 6/2011 | Jin et al. |
| 8,054,472 | B2 | 11/2011 | Shibazaki |
| 9,821,469 | B2 | 11/2017 | Hara |
| 2002/0041377 | A1 | 4/2002 | Hagiwara et al. |
| 2002/0061469 | A1 | 5/2002 | Tanaka |
| 2003/0077879 | A1 | 4/2003 | Ohno et al. |
| 2004/0036850 | A1 | 2/2004 | Tsukamoto et al. |
| 2004/0100624 | A1 | 5/2004 | Hagiwara et al. |
| 2005/0074952 | A1 | 4/2005 | Miyamoto et al. |
| 2005/0082000 | A1* | 4/2005 | Moriya ............. H01J 37/32862 156/345.28 |
| 2007/0064212 | A1 | 3/2007 | Kayama et al. |
| 2007/0103657 | A1 | 5/2007 | Yoshitake et al. |
| 2007/0236857 | A1 | 10/2007 | Lin et al. |
| 2007/0284794 | A1* | 12/2007 | Heiland ................. G05D 19/02 267/140.11 |
| 2008/0106722 | A1 | 5/2008 | Shibazaki |
| 2008/0299784 | A1 | 12/2008 | Jin et al. |
| 2009/0026676 | A1 | 1/2009 | Kurita et al. |
| 2009/0195763 | A1* | 8/2009 | Butler .............. G10K 11/17857 355/53 |
| 2009/0233234 | A1 | 9/2009 | Shibazaki |
| 2009/0311419 | A1* | 12/2009 | Foerster .................... G03F 7/40 427/154 |
| 2010/0073652 | A1 | 3/2010 | Shibazaki |
| 2010/0073653 | A1 | 3/2010 | Shibazaki |
| 2010/0297562 | A1 | 11/2010 | Shibazaki |
| 2011/0085150 | A1 | 4/2011 | Ichinose |
| 2011/0189595 | A1 | 8/2011 | Tanabe |
| 2012/0147346 | A1* | 6/2012 | Van Schoot ........ G03F 7/70558 355/67 |
| 2016/0023356 | A1 | 1/2016 | Hara |

FOREIGN PATENT DOCUMENTS

| | | |
|---|---|---|
| CN | 102549502 A | 7/2012 |
| DE | 102008023907 A1 | 12/2009 |
| JP | S63-260129 A | 10/1988 |
| JP | H06-302550 A | 10/1994 |
| JP | 2003-133261 A | 5/2003 |
| JP | 2006-080289 A | 3/2006 |
| JP | 2006-114640 A | 4/2006 |
| JP | 2007-214336 A | 8/2007 |
| JP | 2007-299864 A | 11/2007 |
| JP | 2008-168413 A | 7/2008 |
| JP | 2009-218372 A | 9/2009 |
| JP | 2009-224519 A | 10/2009 |
| JP | 2010-530636 A | 9/2010 |
| JP | 2010-531541 A | 9/2010 |
| JP | 2011-003891 A | 1/2011 |
| JP | 2013-219069 A | 10/2013 |
| KR | 10-2008-0104580 A | 12/2008 |
| WO | 03/065428 A1 | 8/2003 |
| WO | 2008/156366 A1 | 12/2008 |
| WO | 2008/156367 A1 | 12/2008 |
| WO | 2014/084229 A1 | 6/2014 |

OTHER PUBLICATIONS

Jan. 28, 2014 Written Opinion issued in International Patent Application No. PCT/JP2013/081852.
Feb. 4, 2017 Office Action issued in Chinese Patent Application No. 201380071862.7.
May 2, 2017 Office Action issued in U.S. Appl. No. 14/648,280.
Sep. 12, 2016 Extended Search Report issued in European Patent Application No. 13859307.4.
Dec. 21, 2016 Office Action issued in U.S. Appl. No. 14/648,280.
Jun. 27, 2017 Office Action issued in Japanese Patent Application No. 2014-550208.
Dec. 8, 2017 Office Action issued in U.S. Appl. No. 15/637,069.
Oct. 19, 2018 Office Action issued in U.S. Appl. No. 15/974,965.
May 8, 2019 Office Action issued in Japanese Patent Application No. 2018-107671.
Aug. 9, 2019 Office Action issued in U.S. Appl. No. 16/446,979.
Dec. 31, 2019 Office Action issued in Taiwanese Patent Application No. 108122353.
Jan. 19, 2020 Office Action issued in Chinese Patent Application No. 201810418024.7.
Apr. 13, 2020 Notice of Allowance issued in U.S. Appl. No. 16/446,979.
Apr. 21, 2020 Office Action issued in Korean Patent Application No. 10-2015-7017386.
Dec. 19, 2019 Office Action issued in U.S. Appl. No. 16/446,979.
Nov. 5, 2020 Office Action issued in Japanese Patent Application No. 2019-189302.
Mar. 2, 2021 Office Action issued in Korean Patent Application No. 10-2021-7002828.

* cited by examiner

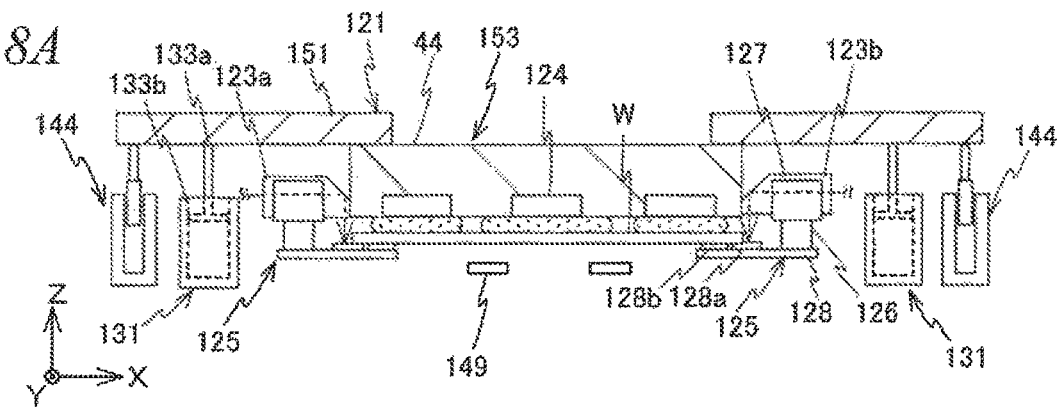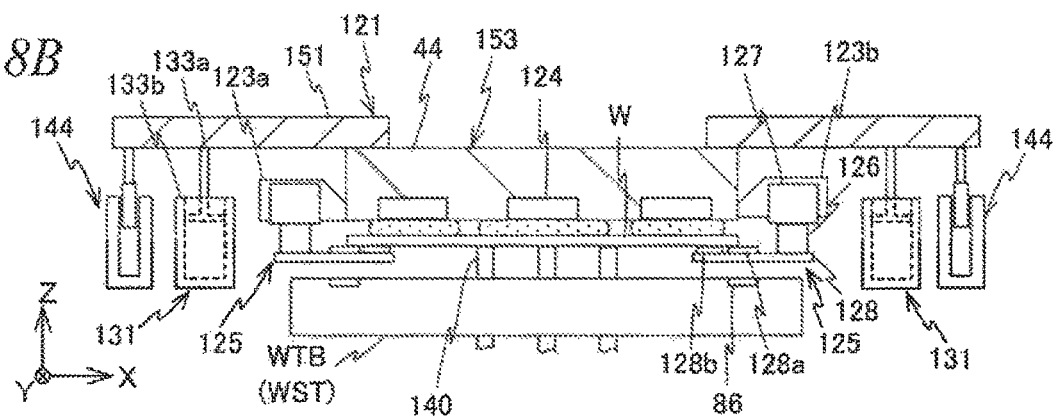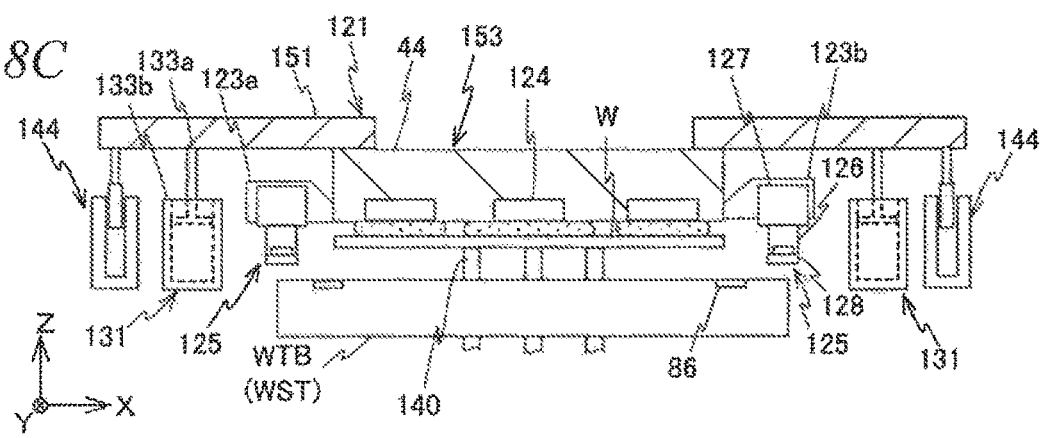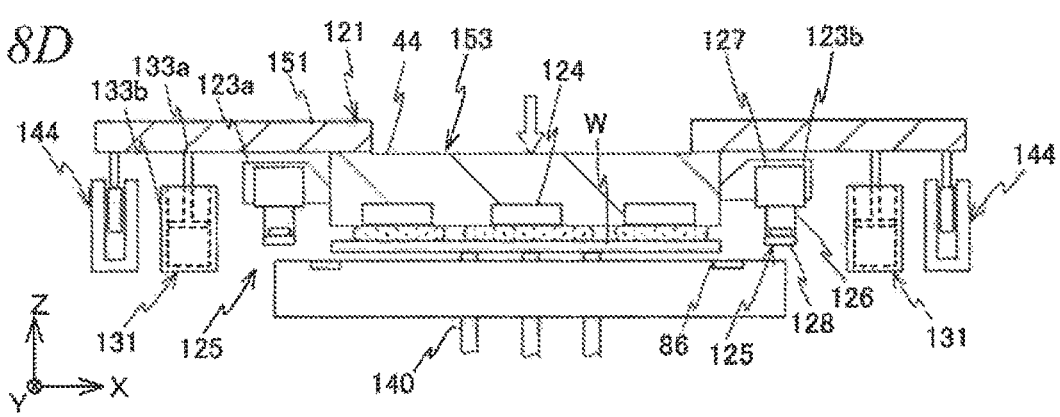

CARRIER SYSTEM, EXPOSURE APPARATUS, CARRIER METHOD, EXPOSURE METHOD, DEVICE MANUFACTURING METHOD, AND SUCTION DEVICE

This is a continuation of U.S. patent application Ser. No. 16/446,979 filed Jun. 20, 2019 (now U.S. Pat. No. 10,744,648), which in turn is a divisional of U.S. patent application Ser. No. 15/974,965 filed May 9, 2018 (now U.S. Pat. No. 10,384,350), which is a divisional of U.S. patent application Ser. No. 15/637,069 filed Jun. 29, 2017 (now U.S. Pat. No. 10,081,108), which is a divisional of U.S. patent application Ser. No. 14/648,280 filed Sep. 17, 2015 (now U.S. Pat. No. 9,821,469), which is the U.S. National Stage of International Application No. PCT/JP2013/081852 filed Nov. 27, 2013, which claims the benefit of U.S. Provisional Application No. 61/731,892 filed Nov. 30, 2012. The disclosure of each of the above-identified prior applications is hereby incorporated by reference in its entirety.

TECHNICAL FIELD

The present invention relates to carrier systems, exposure apparatuses, carrier methods, exposure methods, device manufacturing methods, and suction devices, and more particularly to a carrier system which carries a plate-like object, an exposure apparatus which is equipped with the carrier system, a carrier method to carry a plate-like object onto a movable body, an exposure method using the carrier method, a device manufacturing method using the exposure apparatus or the exposure method, and a suction device which suctions the plate-like object.

BACKGROUND ART

Conventionally, in a lithography process to manufacture electronic devices (microdevices) such as a semiconductor device (an integrated circuit or the like) or a liquid crystal display device, mainly, a projection exposure apparatus of a step-and-repeat method (a so-called stepper), projection exposure apparatus of a step-and-scan method (a so-called scanning stepper (also called a scanner)) or the like is mainly used.

Substrates such as a wafer, a glass plate and the like subject to exposure that are used in these types of exposure apparatuses are gradually becoming larger (for example, in the case of a wafer, in every ten years). Although a 300-mm wafer which has a diameter of 300 mm is currently the mainstream, the coming of age of a 450 mm wafer which has a diameter of 450 mm looms near. When the transition to 450 mm wafers occurs, the number of dies (chips) output from a single wafer becomes double or more than the number of chips from the current 300 mm wafer, which contributes to reducing the cost.

However, because the thickness does not necessarily increase in proportion to the size of the wafer, the 450 mm wafer is weak in intensity and rigidity when compared with the 300 mm wafer. Therefore, when focusing on a point such as a carriage of a wafer, it was considered that there was a risk of warping occurring in the wafer, which may negatively affect the exposure accuracy when a means method similar to the current 300 mm wafer was employed. Accordingly, as the carrier method of the wafer, a proposal is made of a carrier method (carry-in) or the like that can be employed even when the wafer is a 450 mm wafer in which the wafer is suctioned from above in a non-contact manner by a carrier member equipped with a Bernoulli chuck or the like to maintain the flatness degree (flatness) and performs carriage to a wafer holder (holding device) (for example, refer to PTL 1).

However, in the case of employing suction in a non-contact manner from above by the carrier member described above as a carrier method of the wafer onto the wafer stage (wafer holder), there was a risk of positional deviation (rotation deviation) in a horizontal plane of the wafer being generated at an unacceptable level, to which correction based on measurement results was difficult to perform.

CITATION LIST

Patent Literature

U.S. Patent Application Publication No. 2010/0297562

SUMMARY OF INVENTION

Solution to Problem

As a method for resolving the inconvenience due to suction in a non-contact manner from above by the wafer carrier member described above, a method can be considered in which while a wafer is suctioned in a non-contact manner suction from above by a suction member such as a Bernoulli chuck or the like, the wafer is also supported from below by a support member (for example, vertical-motion pins on a wafer stage). However, according to results of experiments and the like of the inventors, in the case of performing loading of the wafer onto the wafer stage in a non-contact suction from above the wafer and support from below, it became clear that warping that is not acceptable could occur even in the case of a 300 mm wafer due to a difference in driving velocity between the suction member and the support member on the loading.

According to a first aspect of the present invention, there is provided a carrier system in which a plate-like object is carried to an object mounting member where an object mounting section is provided, the system comprising: a suction member which has an opposing section opposed to the object, the suction member forming a gas flow between the opposing section and the object to generate a suction force with respect to the object; a measurement device which obtains information related to a shape of the object suctioned by the suction member; a driver which makes the suction member relatively move in a vertical direction in an approaching or separating manner with respect to the object mounting section; and a controller which controls at least one of the suction member and the driver so that the object is mounted on the object mounting section in a predetermined shape, using the information obtained by the measurement device.

According to this system, the object can be carried onto the object mounting member, in a state maintaining high flatness.

According to a second aspect of the present invention, there is provided an exposure apparatus which forms a pattern on an object, the apparatus comprising: the carrier system described above; and a pattern generating device which exposes the object carried onto the object mounting member by the carrier system with an energy beam so as to form the pattern.

According to a third aspect of the present invention, there is provided a device manufacturing method, comprising:

exposing an object using the exposure apparatus described above; and developing the object which has been exposed.

According to a fourth aspect of the present invention, there is provided a carrier method in which a plate-like object is carried to an object mounting member, the method comprising: suctioning the object from above in a non-contact manner at an area above the object mounting member by a suction member; making the suction member relatively move in a vertical direction with respect to the object mounting section by a driver; obtaining information related to a position in the vertical direction for each of a plurality of places of the object suctioned by the suction member; and controlling at least one of the suction member and the driver so that the object is mounted on the object mounting section in a predetermined shape, using the information obtained.

According to this method, the object can be carried onto the object mounting member, in a state maintaining high flatness.

According to a fifth aspect of the present invention, there is provided an exposure method, comprising: carrying the object which is plate-like onto the object mounting member by the carrier method described above; and forming a pattern on the object by exposing the object held by the object mounting member with an energy beam after carriage.

According to a sixth aspect of the present invention, there is provided a device manufacturing method, comprising: exposing an object using the exposure method described above; and developing the object which has been exposed.

According to a seventh aspect of the present invention, there is provided a first suction device which suctions a plate-like object, the device comprising: a suction member having an opposing section which opposes the object, the suction member generating a suction force with respect to the object by blowing out gas from the opposing section; and a measurement device which obtains information related to a shape of the object suctioned by the suction member.

According to a eighth aspect of the present invention, there is provided a second suction device which makes a suction force act on a plate-like object in a non-contact manner, the device comprising: a base member; a plurality of suction sections provided at the base member, each section generating a flow of a gas in the periphery of the object so as to generate a suction force with respect to the object; and an adjustment device which deforms the object, wherein the object is deformed by the adjustment device, while the object is being suctioned by the force generated by the flow of the gas which the plurality of suction sections generated.

According to this device, it becomes possible to deform the object by the adjustment device, for example, so as to secure a desired level of flatness, while the object is being suctioned by the suction force generated by the flow of gas generated by the plurality of suction sections.

BRIEF DESCRIPTION OF DRAWINGS

FIG. 8A is a view (No. 5) used to explain a carry-in operation of a wafer, FIG. 8B is a view (No. 6) used to explain a carry-in operation of a wafer, FIG. 8C is a view (No. 7) used to explain a carry-in operation of a wafer, and FIG. 8D is a view (No. 8) used to explain a carry-in operation of a wafer.

DESCRIPTION OF EMBODIMENTS

An embodiment will be described below, based on FIGS. 1 to 9B.

Figure 1:
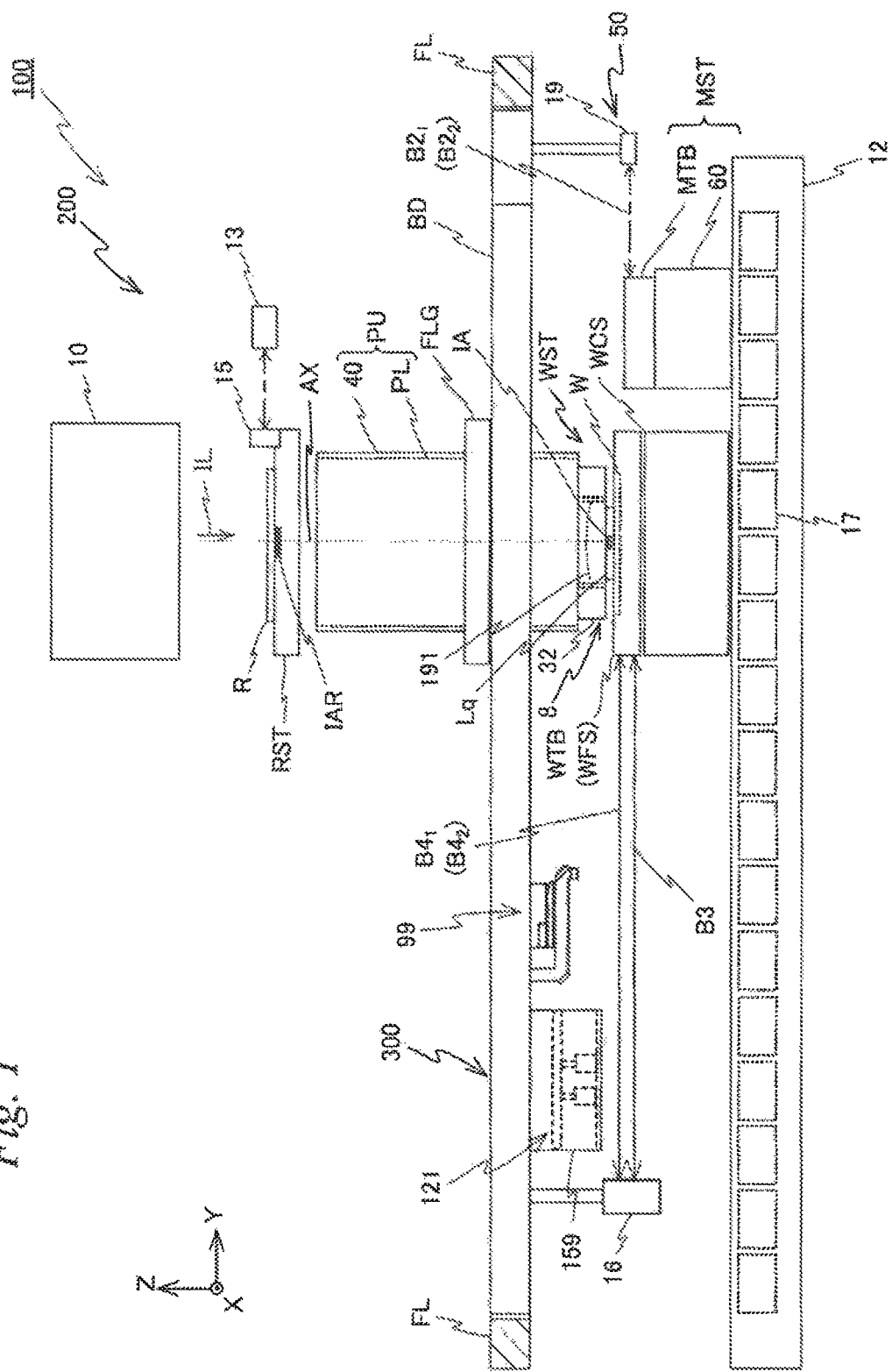
FIG. 1 is a view schematically showing a structure of an exposure apparatus according to an embodiment.

FIG. 1 schematically shows a structure of an exposure apparatus 100 according to an embodiment. This exposure apparatus 100 is a projection exposure apparatus of a step-and-scan method, or a so-called scanner. As it will be described later on, a projection optical system PL is arranged in the present embodiment, and in the description below, a direction parallel to an optical axis AX of this projection optical system PL will be described as a Z-axis direction, a direction within a plane orthogonal to the Z-axis direction in which a reticle and a wafer are relatively scanned will be described as the Y-axis direction, a direction orthogonal to the Z-axis and the Y-axis will be described as an X-axis direction, and rotational (inclination) direction around the X-axis, the Y-axis, and the Z-axis will be described as a θx direction, a θy direction, and a θz direction.

Exposure apparatus 100, as is shown in FIG. 1, is equipped with an exposure section 200 placed at an exposure station placed near the +Y side end on a base board 12, a measurement section 300 placed at a measurement station a predetermined distance apart to the −Y side from exposure section 200, a stage device 50 including a wafer stage WST and a measurement stage MST that move two-dimensionally in an XY plane independently on base board 12, a carry-in unit 121 which structures a carry carrier system 120 (refer to FIG. 6) that carries a wafer W along with a carry-out unit which is not shown and a wafer support member 125 which will be described later on, and a control system or the like of these parts. Here, base board 12 is supported almost horizontally (parallel to the XY plane) on a floor surface by an anti-vibration device (omitted in drawings). Base board 12 consists of a member having a plate-like outer shape.

Further, inside base board 12, a coil unit including a plurality of coils 17 placed in a matrix shape with an XY two-dimensional direction serving as a row direction and a column direction is housed, which structures a stator of a planar motor (to be described later on). Incidentally, in FIG. 1, wafer stage WST is positioned at exposure station, and wafer W is held on wafer stage WST (to be more specific, on wafer table WTB which will be described later on). Further, measurement stage MST is positioned near the exposure station.

Exposure section 200 is equipped with an illumination system 10, a reticle stage RST, a projection unit PU, a local liquid immersion device 8 and the like.

Illumination system 10, as is disclosed in, for example, U.S. Patent Application Publication No. 2003/0025890 and the like, includes a light source, an illuminance equalizing optical system including an optical integrator and the like, and an illumination optical system that has a reticle blind and the like (none of which are shown). Illumination system 10 illuminates a slit-shaped illumination area IAR set (limited) on reticle R by the reticle blind (also called a masking system) by an illumination light (exposure light) IL, with a substantially uniform illuminance. In this case, as illumination light IL, for example, an ArF excimer laser beam (wavelength 193 nm) is used.

On reticle stage RST, reticle R on which a circuit pattern or the like is formed on its pattern surface (the lower surface in FIG. 1) is fixed, for example, by vacuum chucking. Reticle stage RST, for example, is finely drivable within the XY plane by a reticle stage driving system 11 (not shown in FIG. 1, refer to FIG. 6) including a linear motor, a planar motor or the like, and is also drivable in a scanning direction (the Y-axis direction which is the lateral direction of the page surface in FIG. 1) at a predetermined scanning speed.

Position information (including rotation information in the θz direction) of reticle stage RST in the XY plane is constantly detected, for example, by a reticle laser interferometer (hereinafter, referred to as a "reticle interferometer") 13, via a movable mirror 15 (actually, a Y movable mirror (or a retroreflector) having a reflection surface orthogonal to the Y-axis direction and an X movable mirror having a reflection surface orthogonal to the X-axis direction are provided) fixed to reticle stage RST, at a resolution of, for example, around 0.25 nm. Measurement values of reticle interferometer 13 are sent to a main controller 20 (not shown in FIG. 1, refer to FIG. 6). Main controller 20 drives reticle stage RST via reticle stage driving system 11 (refer to FIG. 6), based on the position information of reticle stage RST. Incidentally, in the present embodiment, position information of reticle stage RST in the XY plane can be detected using an encoder, instead of the reticle interferometer described above.

Figure 3:
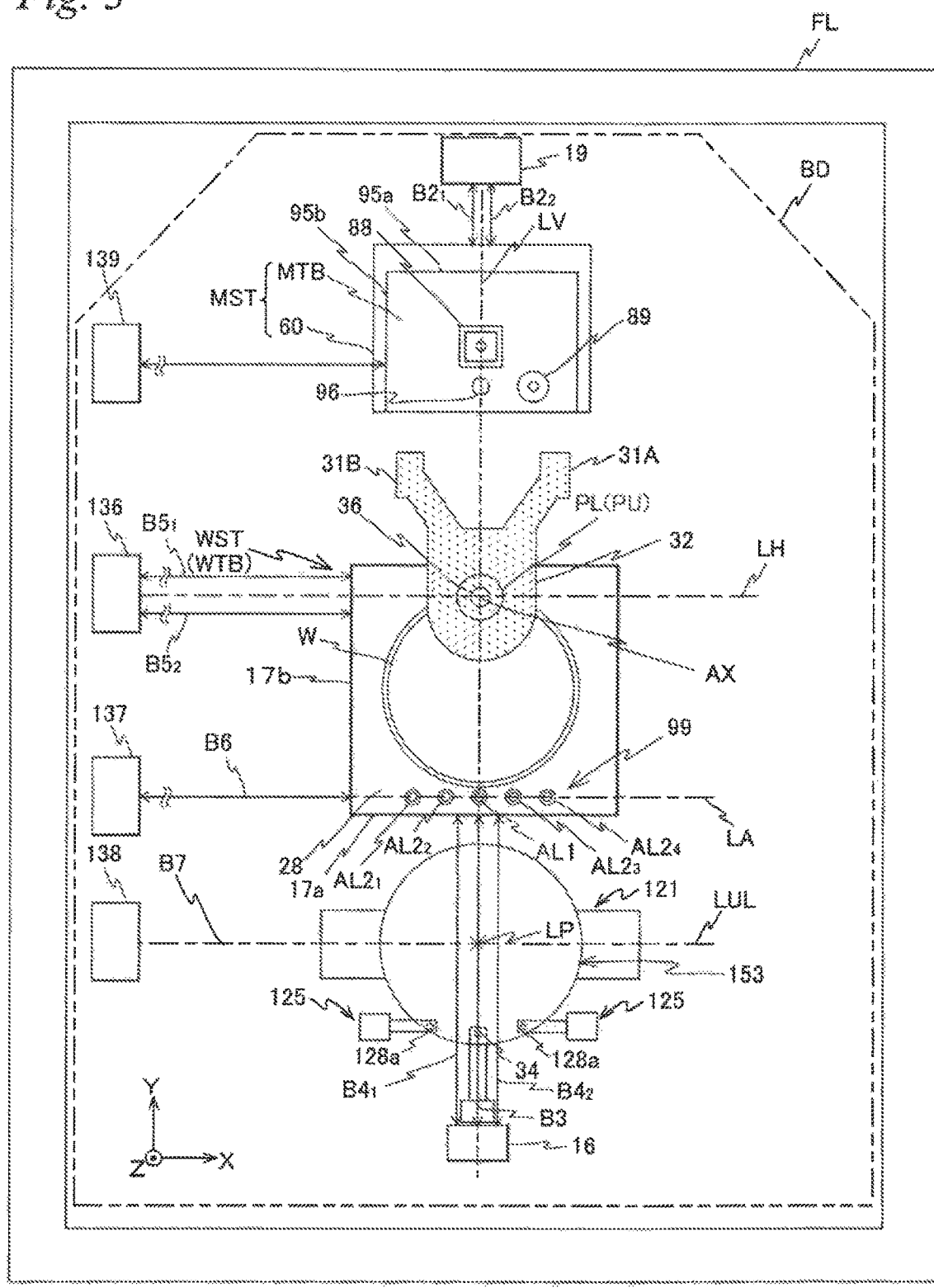
FIG. 3 is a view showing a placement of an interferometer, an alignment system, a multi-point AF system and the like that the exposure apparatus is equipped with, with a projection optical system serving as a reference.

Projection unit PU is placed below reticle stage RST in FIG. 1. Projection unit PU is supported by a mainframe BD, via a flange section FLG provided at an outer circumference section of mainframe BD, which is placed horizontally above base board 12. Mainframe BD, as is shown in FIGS. 1 and 3, consists of a plate member having a hexagonal shape (a shape in which two corners of a rectangular shape is cut off) in a planar view whose dimension in the Y-axis direction is larger than that of the X-axis direction, and is supported on the floor surface by a support member which is not shown including an anti-vibration device which is not shown in a part thereof. As is shown in FIGS. 1 and 3, a frame FL having a rectangular frame shape in a planar view is placed surrounding mainframe BD. Frame FL is supported at a position the same height as mainframe BD on the floor surface by a support member different from the support member supporting mainframe BD. From an end near (a Y position almost the same as a loading position LP which will be described later on) the −Y side of a pair of long sides apart in the X-axis direction of frame FL, a pair of (symmetrical) extended sections 159 that each have an L-shaped XZ section is provided in a protruding manner below (refer to FIG. 4).

Projection unit PU includes a barrel 40, and projection optical system PL held inside barrel 40. Used as projection optical system PL, for example, is a dioptric system consisting of a plurality of optical elements (lens elements) arranged along optical axis AX, which is parallel to the Z-axis. Projection optical system PL, for example, is double telecentric, and has a predetermined projection magnification (for example, ¼ times, ⅕ times or ⅛ times). Therefore, when illumination area IAR on reticle R is illuminated by illumination light IL from illumination system 10, a reduced image of the circuit pattern of reticle R (a reduced image of a part of the circuit pattern) within illumination area IAR is formed in an area (hereinafter, also called an exposure area) IA conjugate to illumination area IAR on wafer W whose surface is coated with a resist (sensitive agent) and is placed on a second surface (image plane) side of projection optical system PL, via projection optical system PL (projection unit PU), by illumination light IL having passed through reticle R placed so that its pattern surface substantially coincides with a first surface (object plane) of projection optical system PL. And, by reticle stage RST and wafer stage WST (to be more precise, fine movement stage WFS to be described later on which holds wafer W) being synchronously driven, scanning exposure of a shot area (divided area) on wafer W is performed, by reticle R being relatively moved in the scanning direction (Y-axis direction) with respect to illumination area IAR (illumination light IL) and wafer W being relatively moved in the scanning direction (Y-axis direction) with respect to exposure area IA (illumination light IL), and the pattern of reticle R is transferred onto the shot area. That is, in the present embodiment, the pattern of reticle R is generated on wafer W by illumination system 10 and projection optical system PL, and by the exposure of the sensitive layer (resist layer) on wafer W with illumination light IL the pattern is formed on wafer W.

Local liquid immersion device 8 is provided, corresponding to exposure apparatus 100 which performs exposure using a liquid immersion method. Local liquid immersion device 8 includes a liquid supply device 5, a liquid recovery device 6 (none of which are shown in FIG. 1, refer to FIG. 6), nozzle unit 32 and the like. Nozzle unit 32, as is shown in FIG. 1, is supported in a suspended manner by mainframe BD supporting projection unit PU and the like, via a support member which is not shown surrounding the lower end periphery of barrel 40 which holds an optical element closest to the image plane side (wafer W side) structuring projection optical system PL, in this case, a lens (hereinafter also referred to as a "tip lens") 191. Nozzle unit 32 is equipped with a supply port and a recovery port of liquid Lq, a lower surface at which the recovery port is provided and to which wafer W is placed oppositely, a supply passage connected to a liquid supply pipe 31A (not shown in FIG. 1, refer to FIG. 3), and a recovery passage connected to a liquid recovery pipe 31B (not shown in FIG. 1, refer to FIG. 3). To liquid supply pipe 31A, connected is one end of a supply pipe which is not shown that has the other end connected to liquid supply device 5 (not shown in FIG. 1, refer to FIG. 6), and to liquid recovery pipe 31B, connected is one end of a recovery pipe which is not shown that has the other end connected to liquid recovery device 6 (not shown in FIG. 1, refer to FIG. 6). In the present embodiment, main controller 20 controls liquid supply device 5(refer to FIG. 6), so that liquid is supplied between tip lens 191 and wafer W via liquid supply pipe 31A and nozzle unit 32, and also controls liquid recovery device 6 (refer to FIG. 6) so that liquid is recovered from between tip lens 191 and wafer W via nozzle unit 32 and liquid recovery pipe 31B. On this operation, main controller 20 controls liquid supply device 5 and liquid recovery device 6 so that the amount of liquid supplied and the amount of liquid recovered are constantly equal. Accordingly, between tip lens 191 and wafer W, a fixed amount of liquid Lq (refer to FIG. 1) is held constantly replaced. In the present embodiment, as liquid Lq described above, pure water is used through which an ArF excimer laser light (light with a wavelength of 193 nm) transmits. Incidentally, refractive index n of the pure water to the ArF excimer laser light is almost 1.44, and in the pure water, the wavelength of illumination light IL is shortened to 193 nm×1/n=around 134 nm. Incidentally, in FIG. 3, a liquid immersion area formed by liquid Lq is shown by a reference sign 36.

Further, in the case measurement stage MST is positioned below projection unit PU, liquid Lq can be filled in between a measurement table MTB to be described later and tip lens 191 in a manner similar to the description above.

Here, although the description goes out of sequence, stage device 50 will now be described. Stage device 50, as is shown in FIG. 1, is equipped with wafer stage WST and measurement stage MST placed on base board 12, an interferometer system 70 (refer to FIG. 6) including Y interferometers 16 and 19 that measure position information of these stages WST and MST, and the like.

Figure 2A:
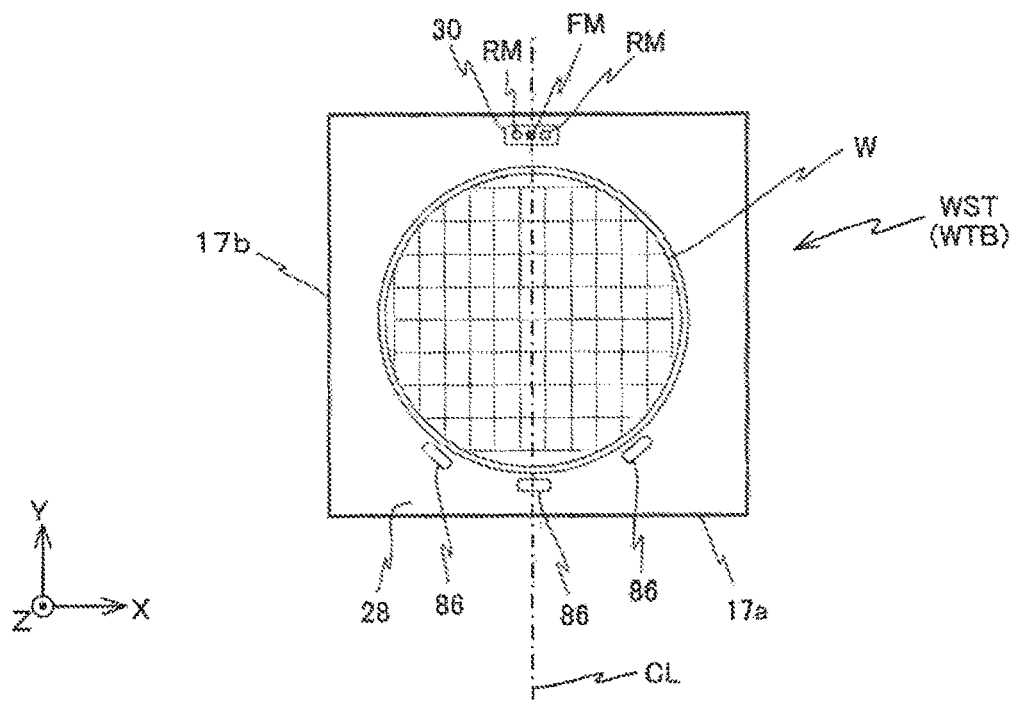
FIG. 2A is a view (planar view) of a wafer stage in FIG. 1 when viewed from a +Z direction.
Figure 2B:
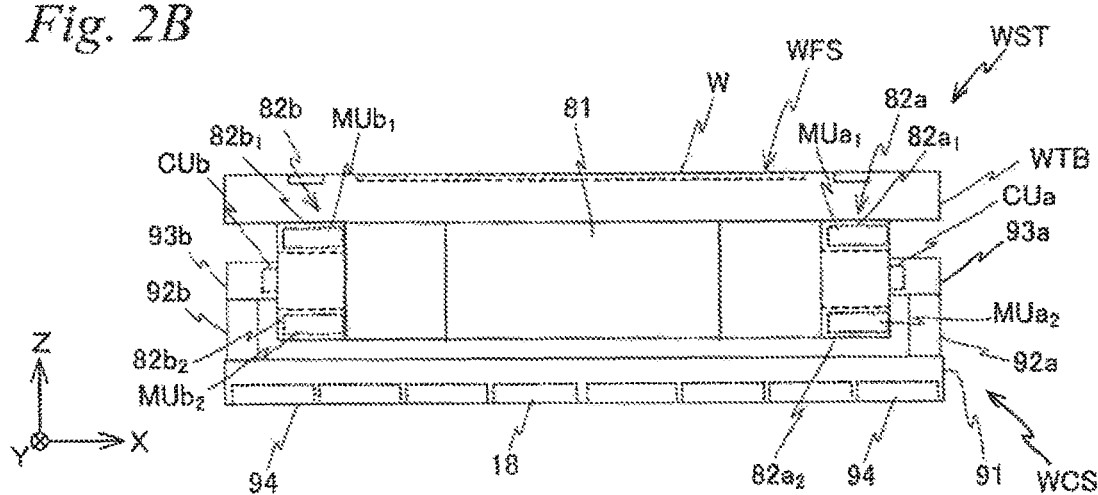
FIG. 2B is a view (front view) of the wafer stage when viewed from a −Y direction.

Wafer stage WST, as it can be seen from FIGS. 1, 2B and the like, has a coarse movement stage WCS, and a fine movement stage WFS, which is supported in a non-contact state by coarse movement stage and is relatively movable with respect to coarse movement stage WCS. Here, wafer stage WST (coarse movement stage WCS) is driven in predetermined strokes in the X-axis direction and the Y-axis direction, and is also finely driven in the θz direction by a coarse movement stage driving system 51A (refer to FIG. 6). Further, fine movement stage WFS is driven in directions of six degrees of freedom (the X-axis direction, the Y-axis direction, the Z-axis direction, the θx direction, the θy direction and the θz direction) by a fine movement stage driving system 52A (refer to FIG. 6), with respect to coarse movement stage WCS.

Coarse movement stage WCS, as is shown in FIG. 2B, is equipped with a coarse movement slider section 91 having a rectangular plate-like shape whose length in the X-axis direction is slightly longer than the length in the Y-axis direction in a planar view (when viewed from the +Z direction), a pair of side wall sections 92a, 92b, each having a rectangular plate-like shape with the longitudinal direction being the Y-axis direction, and being fixed on the upper surface of one end and the other end of coarse movement slider section 91 in the longitudinal direction in a state parallel to the YZ plane, and a pair of stator sections 93a, 93b fixed on the upper surface of side wall sections 92a, 92b, respectively, at the center in the Y-axis direction facing the inner side. Incidentally, side wall sections 92a, 92b can have almost the same length in the Y-axis direction as stator sections 93a, 93b. That is, side wall sections 92a, 92b may be provided only at the center in the Y-axis direction on the upper surface of coarse movement slider section 91, at one end and the other end in the longitudinal direction.

At the bottom surface of coarse movement stage WCS, that is, at the b base board 12 is provided, consisting of a plurality of permanent magnets 18 placed in the shape of a matrix with the XY two-dimensional directions serving as a row direction and the column direction, as is shown in FIG. 2B. The magnet unit, along with the coil unit of base board 12, structures coarse movement stage driving system 51A (refer to FIG. 6) consisting of a planar motor of an electromagnetic force (Lorentz force) driving method whose details are disclosed, for example, in U.S. Pat. No. 5,196,745 and the like. The magnitude and direction of the electric current supplied to each coil 17 (refer to FIG. 1) structuring the coil unit are controlled by main controller 20.

At the bottom surface of coarse movement slider section 91, a plurality of air bearings 94 is fixed around the magnet unit described above. Coarse movement stage WCS is supported by levitation by the plurality of air bearings 94, via a predetermined gap (clearance, gap) above base board 12, such as for example, a gap of about several μm, and is driven in the X-axis direction, the Y-axis direction and the θz direction by coarse movement stage driving system 51A.

Incidentally, coarse movement stage driving system 51A is not limited to the planar motor of the electromagnetic force (Lorentz force) driving method, and for example, a planar motor of a variable magneto-resistance driving method can also be used. Other than this, coarse movement stage driving system 51A can be structured by a magnetic levitation type planar motor, and the planar motor can driving coarse movement stage ottom surface of coarse movement slider section 91, a magnet unit corresponding to the coil unit placed inside WCS in directions of six degrees of freedom. In this case, the air bearings will not have to be arranged at the bottom surface of coarse movement slider section 91.

Each of the pair of stator sections 93a, 93b, for example, consists of a member having an outer shape that is a rectangular plate shape, and inside each member, coil units CUa, CUb consisting of a plurality of coils are housed. The magnitude and direction of the electric current supplied to each coil structuring coil units CUa, CUb is controlled by main controller 20.

Fine movement stage WFS, as is shown in FIG. 2B, for example, is equipped with a main section 81 consisting of a low-height columnar member having an octagonal shape in a planar view, a pair of mover sections 82a, 82b each fixed to one end and the other end in the X-axis direction of a main section 81, and a wafer table WTB consisting of a rectangular plate-shaped member when viewed from above, which is integrally fixed to the upper surface of main section 81.

Main section 81 is preferably made of a material having a thermal expansion coefficient is the same or around the same level as that of wafer table WTB, and the material is preferably a material having a low thermal expansion coefficient.

Here, although it is omitted in the drawing in FIG. 2B, at main section 81, a plurality of (for example, three) vertical-motion pins 140 (refer to FIG. 4) being vertically movable is provided, which are inserted into through holes which are not shown formed in wafer table WTB (and in a wafer holder which is not shown). At the upper surface of each of the three vertical-motion pins 140, an exhaust opening (not shown) is formed for vacuum exhaust. Further, each of the three vertical-motion pins 140 has the lower end surface fixed to the upper surface of a platform member 141. Each of the three vertical-motion pins 140 is placed at a position which is almost the vertex of an equilateral triangle in a planar view on the upper surface of platform member 141.

The exhaust openings formed at each of the three vertical-motion pins 140 communicates with a vacuum pump (not shown), via an exhaust pipeline formed inside vertical-motion pin 140 (and platform member 141) and a vacuum exhaust piping which is not shown. Platform member 141 is connected to a driver 142, via a shaft 143 fixed at the center of the lower surface. That is, the three vertical-motion pins 140 are driven in the vertical direction by driver 142, integrally with platform member 141. In the present embodiment, platform member 141, the three vertical-motion pins 140 and shaft 143 structure a wafer center supporting member (hereinafter shortened to a center supporting member) 150, which can support from below a part of a center section area of the wafer lower surface. Here, displacement in the Z-axis direction from a reference position of the three vertical-motion pins 140 (center supporting member 150) is detected by a displacement sensor 145 (not shown in FIG. 4, refer to FIG. 6), such as, for example, the encoder system provided at driver 142. Main controller 20, based on measurement values of displacement sensor 145, drives the three vertical-motion pins 140 (center supporting member 150) in the vertical direction via driver 142.

Referring back to FIG. 2B, each of the pair of mover sections 82a, 82b has a housing whose YZ section is a rectangular frame shape, which is fixed, respectively, to a surface at one end and a surface at the other end in the X-axis direction of main section 81. Hereinafter, for the sake of convenience, the housings will be described as housings 82a, 82b using the same reference signs as mover sections 82a, 82b.

Housing 82a has an opening section formed whose YZ section is a rectangular shape elongate in the Y-axis direction, with the Y-axis direction dimension (length) and the Z-axis direction dimension (height) both slightly longer than stator section 93a. In the opening section of housings 82a, 82b, the end on the −X side of stator section 93a of coarse movement stage WCS is inserted in a non-contact manner. Inside an upper wall section 82a, and a bottom wall section $82a_2$ of housing 82a, magnet units $MUa_1$, $MUa_2$ are provided.

Mover section 82b is structured in a similar manner, although the structure is symmetrical to mover section 82a. In the hollow section of housing (mover section) 82b, the end on the +X side of stator section 93b of coarse movement stage WCS is inserted in a non-contact manner. Inside an upper wall section $82b_1$ and bottom wall section $82b_2$ of housing 82b, magnet units $MUb_1$, $MUb_2$ are provided, which are structured similarly to magnet units $MUa_1$, $MUa_2$.

Coil units CUa, CUb described above are housed, respectively, inside stator sections 93a and 93b so that the units face magnet units $MUa_1$, $MUa_2$ and magnet units $MUb_1$, $MUb_2$.

The structure of magnet units $MUa_1$, $MUa_2$ and magnet units $MUb_1$, $MUb_2$, and coil units CUa, Cub, is disclosed in detail, for example, in U.S. Patent Application Publication No. 2010/0073652, U.S. Patent Application Publication No. 2010/0073653 and the like.

In the present embodiment, fine movement stage driving system 52A (refer to FIG. 6) in which fine movement stage WFS is supported by levitation in a non-contact state with respect to coarse movement stage WCS and is also driven in a non-contact manner in directions of six degrees of freedom is structured similarly to the U.S. Patent Application Publication No. 2010/0073652 and the U.S. Patent Application Publication No. 2010/0073653 described above, including the pair of magnet units $MUa_1$, $MUa_2$ that mover section 82a previously described has and coil unit CUa that stator section 93a has, and the pair of magnet units $MUb_1$, $MUb_2$ that mover section 82b has and coil unit CUb that stator section 93b has.

Incidentally, in the case of using the magnetic levitation type planar motor as coarse movement stage driving system 51A (refer to FIG. 6), because fine movement stage WFS can be finely driven in the Z-axis direction, the θx direction and the θy direction integrally with coarse movement stage WCS by the planar motor, fine movement stage driving system 52A can be structured so that fine movement stage WFS is drivable in the X-axis direction, the Y-axis direction and the θz direction, or that is, in directions of three degrees of freedom in the XY plane. Other than this, for example, to each of the pair of side wall sections 92a, 92b of coarse movement stage WCS, a pair of electromagnets each can be provided facing the oblique side of the octagonal shape of fine movement stage WFS, and facing each electromagnet a magnetic body member can be provided at fine movement stage WFS. With this arrangement, since fine movement stage WFS can be driven in the XY plane by the magnetic force of the electromagnet, this allows a pair of Y-axis linear motors to be structured by mover sections 82a, 82b and stator sections 93a, 93b.

In the center on the upper surface of wafer table WTB, wafer W is fixed by vacuum suction or the like, via a wafer holder provided at a hold section of the wafer such as a pin chuck which is not shown or the like. While the wafer holder may be formed integral with wafer table WTB, in present embodiment, the wafer holder and wafer table WTB are structured separately, and the wafer holder is fixed in a recess section of wafer table WTB, for example, by vacuum chucking or the like. Further, on the upper surface of wafer table WTB, as is shown in FIG. 2A, a plate (liquid-repellent plate) 28 is provided that has a surface (liquid-repellent surface), substantially flush to the surface of the wafer mounted on the wafer holder, to which liquid-repellent processing with respect to liquid Lq is applied, also has a rectangular outer shape (contour) with a circular opening one-size larger than the wafer holder (mounting area of the wafer) formed in the center section. Plate 28 consists of a material having a low thermal expansion coefficient, such as for example, glass or ceramics (for example, Zerodur (brand name) of Schott Corporation, $Al_2O_3$, TiC or the like), and to its surface, liquid-repellent processing with respect to liquid Lq is applied. To be more specific, the liquid-repellent film is formed, for example, by a fluorine-based resin material such as fluororesin material, polytetrafluoroethylene (Teflon (registered trademark)), an acrylic-based resin material, a silicon-based resin material, or the like. Incidentally, plate 28 is fixed to the upper surface of wafer table WTB, so that the entire (or a part of the) surface is flush with the surface of wafer W.

Near the end on the +Y side of plate 28, a measurement plate 30 is provided. At this measurement plate 30, a first fiducial mark FM is provided in the center positioned on a center line CL of wafer table WTB, and a pair of second reference marks RM used for reticle alignment is provided with the first fiducial mark FM arranged in between.

On wafer table WTB, as is shown in FIG. 2A, a plurality of (for example, three) reflection mirrors 86 are provided near the wafer holder. The three reflection mirrors 86 are placed so that one is placed at a position near the −Y side of the wafer holder (a position where a notch of wafer W faces, coinciding on center line CL, that is, a position in a six o'clock direction with respect to the center of wafer W in a planar view), and one each is placed symmetrical to center line CL, in a five o'clock direction and in a seven o'clock direction with respect to the center of wafer W in a planar view. Incidentally, in FIG. 2A, for the sake of convenience in the drawings, while reflection mirrors 86 are illustrated on the outer side of the circular opening of the wafer plate, the mirrors are actually placed at a border section of the circular opening of plate 28 and the wafer holder, within the gap between plate 28 and wafer W. Below these reflection mirrors 86, a porous body is provided, and liquid Lq remaining on wafer table WTB that could not be recovered by liquid recovery device 6 is recovered, via the porous body.

To each of the −Y end surface and the −X end surface of wafer table WTB, mirror polishing is applied, and a reflection surface 17*a* and a reflection surface 17*b* are formed, as is shown in FIG. 2A.

Measurement stage MST, as is shown in FIG. 3, is equipped with a stage main section 60, and measurement table MTB mounted on stage main section 60.

At the bottom surface of stage main section 60, although it is not shown, a magnet unit consisting of a plurality of permanent magnets is provided, which structures a measurement stage driving system 51B (refer to FIG. 6) consisting of a planar motor that employs an electromagnetic force (Lorentz force) driving method, along with the coil unit (coil 17) of base board 12. At the bottom surface of stage main section 60, a plurality of air bearings (not shown) is fixed, in the periphery of the magnet unit. Measurement stage MST, by the air bearings previously described, is supported in a levitated manner above base board 12 via a predetermined clearance gap (gap, clearance), such as for example, a clearance gap of around several μm, and is driven in the X-axis direction and the Y-axis direction by measurement stage driving system 51B. Incidentally, measurement stage MST can be structured, having a coarse movement stage driven in directions of three degrees of freedom in the XY plane, and a fine movement stage driven in the remaining three degrees of freedom with respect to the coarse movement stage (or in six degrees of freedom). Incidentally, in the case measurement stage driving system 51B is structured using the magnetic levitation type planar motor, for example, the measurement stage can be a single stage which is movable in directions of six degrees of freedom.

Measurement table MTB consists of a member having a rectangular shape in a planar view. At measurement table MTB, various kinds of measurement members are provided. As such measurement members, for example, an illuminance irregularity sensor 88 having a pin-hole shaped light receiving section which receives illumination light IL on the image plane of projection optical system PL, an aerial image measuring instrument 96 which measures light intensity of an aerial image (projection image) of a pattern projected by projection optical system PL, and a wavefront aberration measuring instrument 89 are employed. As the illuminance irregularity sensor, a sensor having a structure similar to the one disclosed in, for example, U.S. Pat. No. 4,465,368 and the like can be used. Further, as the aerial image measuring instrument, an instrument having a structure similar to the one disclosed in, for example, U.S. Patent Application Publication No. 2002/0041377 and the like can be used. Further, as the wavefront aberration measuring instrument, an instrument having a structure similar to the one disclosed in, for example, PCT International Publication No. 03/065428 (corresponding U.S. Pat. No. 7,230,682) and the like can be used. Incidentally, adding to each sensor described above, an illuminance monitor can be employed having a light receiving section of a predetermined area which receives illumination light IL on the image plane of projection optical system PL, whose details are disclosed in, for example, U.S. Patent Application Publication No. 2002/0061469 and the like.

Incidentally, in the present embodiment, the surface of measurement table MTB (the measurement members previously described can be included) is also covered with a liquid-repellent film (water-repellent film).

Mirror polishing is applied to each of the +Y side surface and the −X side surface of measurement table MTB, and a reflection surface 95*a* and a reflection surface 95*b* is formed similar to wafer table WTB described above.

Next, interferometer system 70 which measures position information of wafer stage WST and measurement stage MST will be described.

Interferometer system 70 (refer to FIG. 6) includes a plurality of interferometers that measure position information of wafer stage WST (wafer table WTB) or measurement stage MST (measurement table MTB), or to be more specific, two Y interferometers 16 and 19, and four X interferometers 136, 137, 138 and 139 and the like. In the present embodiment, as each interferometer described above, a multi-axis interferometer having a plurality measurement axes is used except for a part of the interferometers.

Y interferometer 16, as is shown in FIGS. 1 and 3, irradiates measurement beams $B4_1$ and $B4_2$ on reflection surface 17*a* of wafer table WTB, along measurement axes in the Y-axis direction which are apart by the same distance to the −X side and the +X side from a straight line (hereinafter, called a reference axis) LV (refer to FIG. 3) parallel to the Y-axis that passes through a projection center (optical AX, refer to FIG. 1) of projection optical system PL, and receives the reflected lights. Further, Y interferometer 16 irradiates a measurement beam B3 toward reflection surface 17*a*, along a measurement axis (for example, a measurement axis on reference axis LV) which is parallel to the Y-axis and is between measurement beams $B4_1$ and $B4_2$ with a predetermined spacing in the Z-axis direction, and receives measurement beam B3 reflected off reflection surface 17*a*.

Y interferometer 19 irradiates two measurement beams $B2_1$ and $B2_2$, for example, along measurement axes in the Y-axis direction which are the same distance to the −X side and the +X side from reference axis LV, on reflection surface 95*a* of measurement table MTB, and receives each of the reflected lights.

X interferometer 136, as is shown in FIG. 3, irradiates measurement beams $B5_1$ and $B5_2$ along two measurement axes which are the same distance apart with respect to a straight line (reference axis) LH in the X-axis direction and passes the optical axis of projection optical system PL, on reflection surface 17*b* of wafer table WTB, and receives each of the reflected lights.

X interferometer 137, as is shown in FIG. 3, irradiates a measurement beam B6 along a straight line LA, which passes through a detection center of a primary alignment system AL1 to be described later and is parallel to the X-axis, on reflection surface 17*b* of wafer table WTB, and receives the reflected light.

X interferometer 138 irradiates a measurement beam B7 along a straight line LUL, which passes through loading position LP where loading of the wafer is performed and is parallel to the X-axis, on reflection surface 17*b* of wafer table WTB, and receives the reflected light.

X interferometer 139 irradiates a measurement beam parallel to the X-axis with respect to reflection surface 95*b*, and receives the reflected light.

Figure 6:
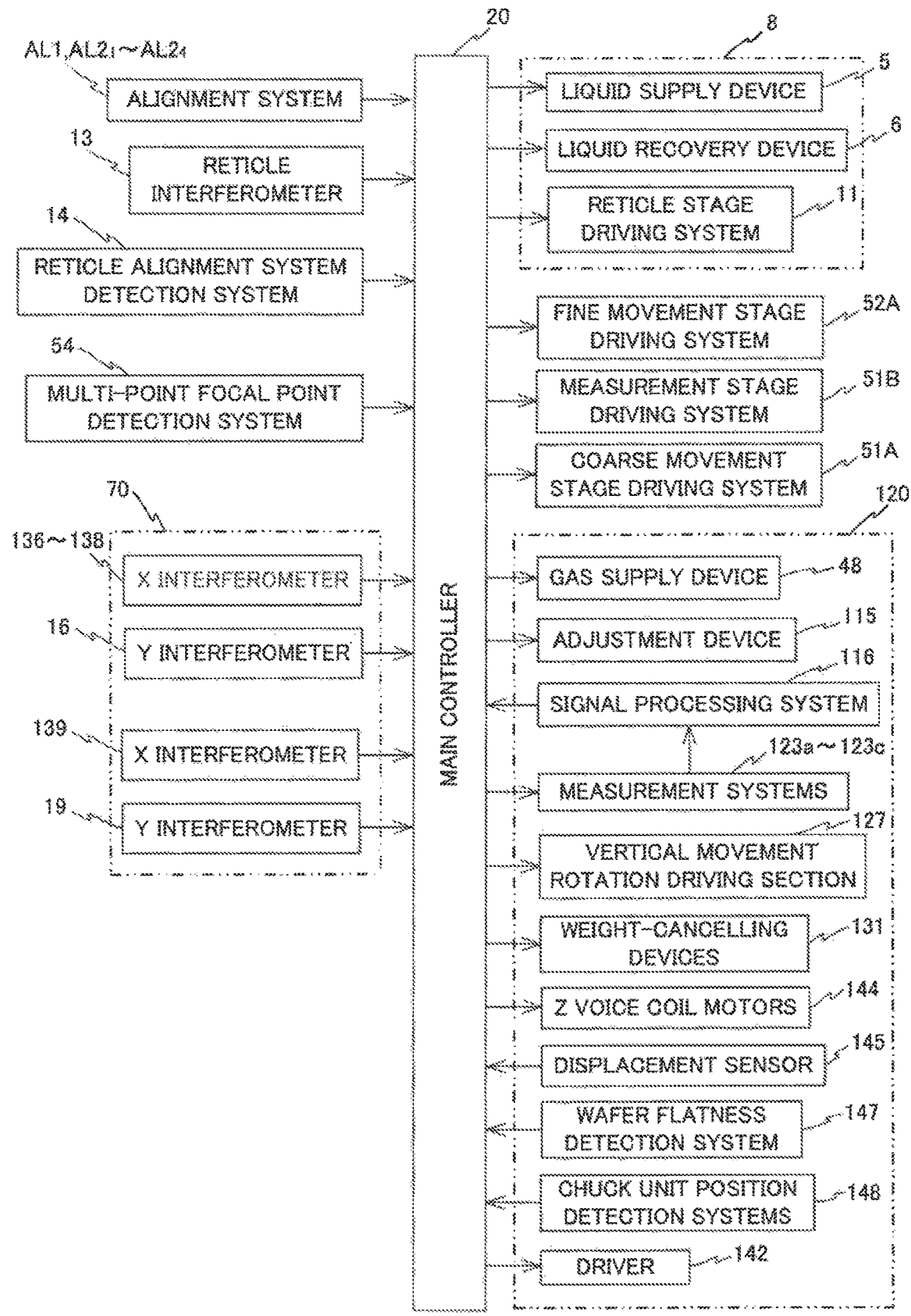
FIG. 6 is a block diagram showing an input/output relation of a main controller which mainly structures a control system of the exposure apparatus according to the embodiment.

Measurement values (measurement results on position information) of each interferometer of interferometer system 70 are supplied to main controller 20 (refer to FIG. 6). Main controller 20 obtains position information related to the Y-axis direction, the θx direction and the θz direction of wafer table WTB, based on the measurement values of Y interferometer 16. Further, main controller 20 obtains position information related to the X-axis direction of wafer table WTB, based on the output of X interferometers 136, and either 137 or 138. Incidentally, main controller 20 can obtain the position information related to the θz direction of wafer table WTB, based on the measurement values of X interferometer 136.

Further, main controller 20 obtains position information related to the X-axis direction, the Y-axis direction, and the θz direction of measurement table MTB (measurement stage MST), based on measurement values of Y interferometer 19 and X interferometer 139.

Other than these sections, interferometer system 70 is equipped with a Z interferometer system, in which a pair of Z interferometers that irradiate a pair of measurement beams set apart in the Z-axis direction and parallel to the Y-axis on a pair of fixed mirrors, via a vertical pair of reflection surfaces of a movable mirror fixed to a side surface on the −Y side of coarse movement stage WCS, and receive return lights from the pair of fixed mirrors via the reflection surfaces, is placed away from reference axis LV by the same distance to the −X side and to the +X side. Based on measurement values of the Z interferometer system, main controller 20 obtains position information of wafer stage WST related to directions of at least three degrees of freedom including, the Z-axis direction, the θy direction and the θz direction.

Incidentally, a detailed structure and an example of details of a measurement method for interferometer system 70 are disclosed in detail, for example, in U.S. Patent Application Publication No. 2008/0106722 and the like.

While an interferometer system was used in the present embodiment to measure information related to the position of wafer stage WST or measurement stage MST, a different means can be used. For example, it is also possible to use an encoder system such as the one described in U.S. Patent Application Publication No. 2010/0297562.

Referring back to FIG. 1, measurement section 300 is equipped with an alignment system device 99 attached to a lower surface of mainframe BD, and other measurement systems.

Alignment system device 99 includes five alignment systems shown in FIGS. 3, AL1 and AL2$_1$ to AL2$_4$. To describe this in detail, primary alignment system AL1 is placed in a state where its detection center is positioned passing through the center of projection unit PU (optical axis AX of projection optical system. PL, also coincides with the center of exposure area IA previously described in the present embodiment) and on reference axis, at a position apart by a predetermined distance to the −Y side from optical axis AX. On one side and the other side in the X-axis direction with primary alignment system. AL1 in between, secondary alignment systems AL2$_1$,AL2$_2$ and AL2$_3$,AL2$_4$ are provided, respectively, with the detection centers placed almost symmetrically to reference axis LV. That is, the five alignment systems AL1 and AL2$_1$ to AL2$_4$ are placed, with their detection centers arranged along the X-axis direction. Incidentally, in FIG. 1, the systems are shown as alignment system device 99, including the five alignment systems AL1 and AL2$_1$ to AL2$_4$ and the holding devices that hold these systems.

As each of the five alignment systems AL1 and AL2$_1$ to AL2$_4$, for example, an FIA (Field Image Alignment) system of an image processing method is used, in which a broadband detection beam that does not sensitize the resist on the wafer is irradiated on a subject mark, an image of the subject mark formed on the light-receiving plane by a reflected light from the subject mark and an image of an index (an index pattern on an index plate provided in each alignment system) which is not shown are formed using an image-forming element (CCD or the like), 99 is disclosed in, for example, U.S. Patent Application Publication No. 2009/0233234.

Carry-in unit 121 (refer to FIG. 1) structuring a part of carrier system 120 is a unit for holding the wafer before exposure above loading position LP prior to the loading onto wafer table WTB, and for loading the wafer onto wafer table WTB. Further, the carry-out unit which is not shown is a unit for unloading the wafer after exposure from wafer table WTB.

Figure 4:
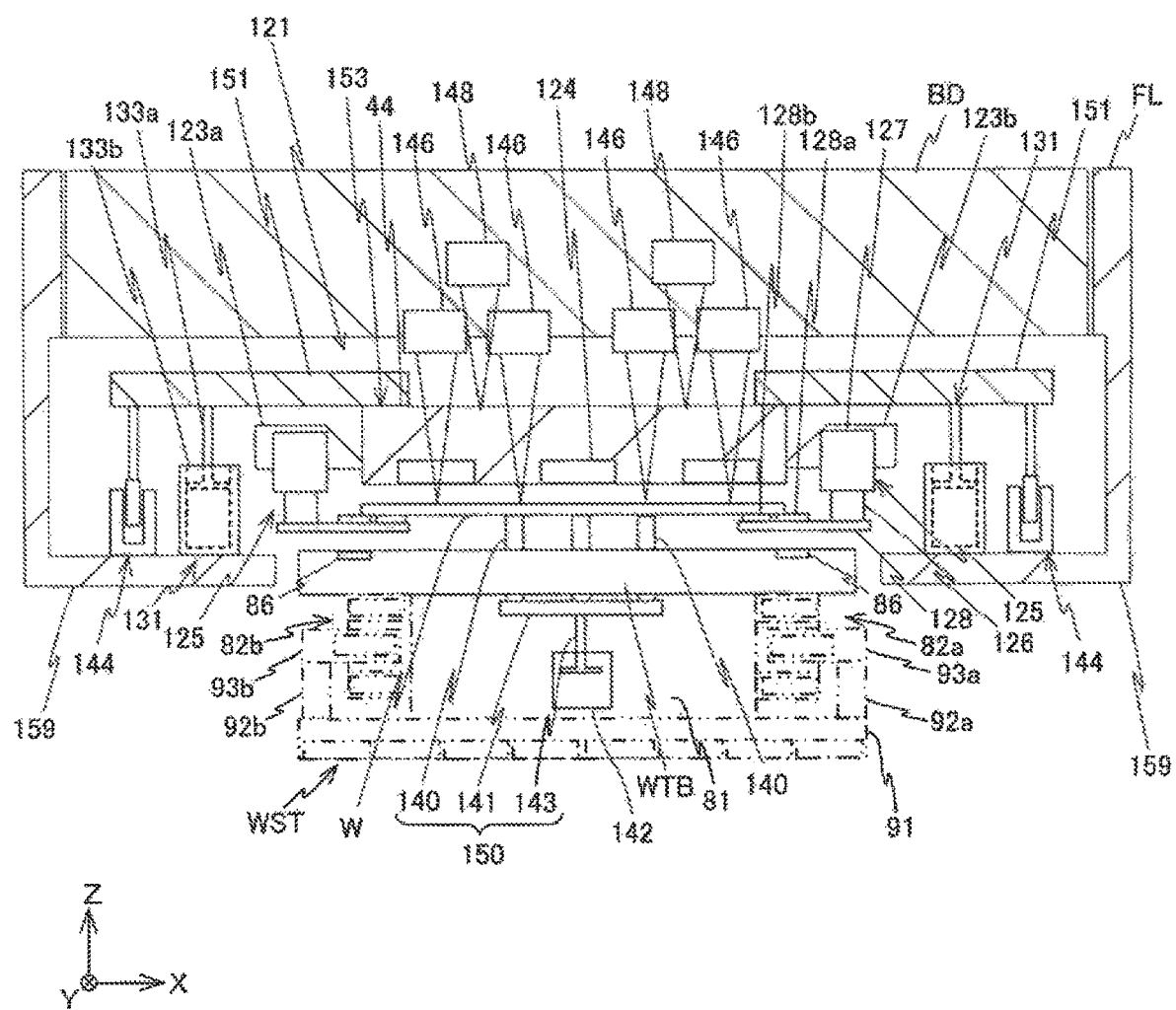
FIG. 4 is a view (front view) of a carry-in unit and the wafer stage in FIG. 1 when viewed from the −Y direction.

Carry-in unit 121, as is shown in FIGS. 3 and 4, has a chuck unit 153 consisting of a circular plate-like member in a planar view (when viewed from above) that suctions wafer W from above in a non-contact manner, a plurality of, for example, a pair of Z voice coil motors 144 which drives chuck unit 153 in a vertical direction, a plurality of, for example, a pair of weight-cancelling devices 131 which supports the self-weight of chuck unit 153, a pair of wafer support members 125 which supports from below wafer W suctioned by chuck unit 153, and the like.

Chuck unit 153, as is shown in FIG. 4, is equipped with, for example, a plate member (plate) 44 of a predetermined thickness having a circular shape in a planar view, and a plurality of chuck members 124 embedded at predetermined places at the lower surface of plate member 44. Here, inside of plate member 44, piping and the like are provided, and by a liquid adjusted to a predetermined temperature flowing in the piping, the plate member also serves to function as a and imaging signals are output. The imaging signals from the five alignment systems AL1 and AL2$_1$ to AL2$_4$ are supplied to main controller 20 (refer to FIG. 6). Incidentally, a detailed structure of alignment system device cooling plate to control the temperature of the wafer to a predetermined temperature. However, plate member 44 does not necessarily have to function as a cooling plate as well.

Figure 5:
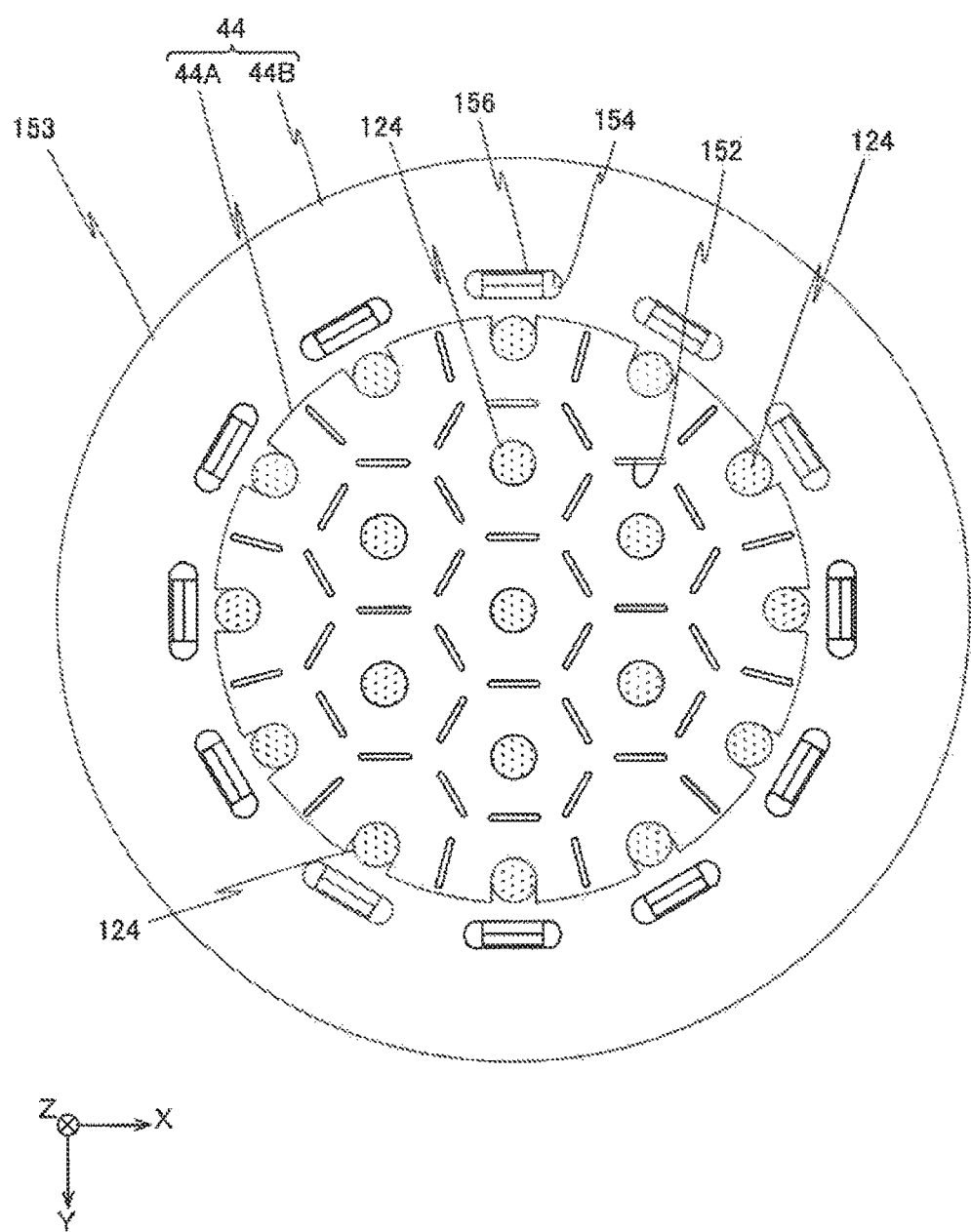
FIG. 5 is a view of a chuck unit in FIG. 4 when viewed from a −Z direction.

In the present embodiment, as is shown in FIG. 5 which is a planar view of chuck unit 153 when viewed from the −Z direction, plate member 44 is two members, a disc-shaped first member 44A and a concentric ring-shaped second member 44B placed on the outer side of the first member, that are integrally structured. However, the two members do not necessarily have to be placed concentrically. Further, the plate member does not necessarily have to be structured by two members.

At the lower surface of the first member 44A, chuck member 124 is placed at a plurality of (for example, nineteen) points, at a point on its center (center point), and on points spaced equally apart on a virtual double concentric circle with the point serving as the center. To describe this in detail, on the virtual circle on the inner side, chuck member 124 is placed at six points with the central angle thereof set to 60 degrees, and on the virtual circle on the outer side, chuck member 124 is placed spaced apart at twelve points with the central angle thereof set to 30 degrees, the points including six points which are on straight lines joined from the point at the center to the six points described above. The lower surface of each of the plurality of, or a total of nineteen, chuck members 124, is embedded into the lower surface of plate member 44 (refer to FIG. 4), in a state flush with the lower surface of plate member 44.

Incidentally, the placement of the chuck members is not limited to this, and the chuck members do not necessarily have to be equally spaced.

Each chuck member 124 consists of a so-called Bernoulli chuck. Bernoulli chuck, as is well known, is a chuck that uses the Bernoulli effect to locally increase the flow velocity of fluid (for example, air) which is blowing out to suction the target object (hold in a non-contact manner)). Here, the Bernoulli effect is an effect in which the pressure of fluid decreases when the flow velocity increases, and with the Bernoulli chuck, the suction state (holding/floating state) is decided by the weight of the target object subject to suction (hold, fix), and the flow velocity of fluid blowing out from the chuck. That is, in the case the size of the target object is known, the size of the gap between the chuck and the target object subject to hold upon the suction is decided, according to the flow velocity of the fluid blowing out from the chuck. In the present embodiment, chuck member 124 is used to suction wafer W by blowing out gas from its gas flow hole (for example, a nozzle or a blowout port) or the like to generate a flow of gas (gas flow) in the periphery of wafer W. The degree of the force of suction (that is, the flow velocity and the like of the gas blowing out) is appropriately adjustable, and by holding wafer W by suction with chuck member 124, movement in the Z-axis direction, the θx direction and the θy direction can be restricted.

With the plurality of (nineteen) chuck members 124, at least one of flow velocity, flow amount, and direction of blowout (blowout direction of the gas) or the like of the gas blowing out from each of the chuck members is controlled by main controller 20, via an adjustment device 115 (refer to FIG. 6). This allows the suction force of each chuck member 124 to be set individually to an arbitrary value. Incidentally, the plurality of (nineteen) chuck members 124 can be structured so that the suction can be set for each group decided in advance. Incidentally, main controller 20 can control the temperature of the gas.

In the first member 44A, as is shown in FIG. 5, a plurality of through holes 152 having a small width (elongated) is formed, surrounding each of the plurality of chuck members 124. To be more specific, a part of the plurality of through holes 152 is placed so as to structure each side of a hexagon surrounding each of the seven chuck members 124 that exclude the twelve chuck members 124 positioned at the outer circumference section. The remaining parts of through holes 152 are placed surrounding half of the center section side of the twelve chuck members 124 positioned at the outer circumference section, along with some of the part of the through holes 152. The fluid (for example, air) blown out toward wafer W from chuck members 124 when wafer W is suctioned with chuck members 124 in the manner described later on, is exhausted outside (above chuck unit 153) via through hole 152.

Near the inner circumference section of the second member 44B, a plurality of (for example, twelve) through holes 154 are formed on the outer side of each of the twelve chuck members 124 positioned at the outer circumference section of the first member 44A. Inside each through hole 154, a porous bearing 156 is provided consisting of a ceramic porous body. A plurality of (for example, twelve) porous bearings 156 are each connected to a gas supply device 48 (refer to FIG. 6) consisting of, for example, a compressor or the like via a piping (not shown). Upon suction of wafer W to be described later on by chuck unit 153, gas (for example, pressurized air) supplied from gas supply device 48 blows out downward (toward wafer W) from each porous bearing 156 so as to prevent wafer W from coming into contact with chuck unit 153. The pressure, flow amount and the like of gas supplied to each porous bearing 156 are controlled by main controller 20 (refer to FIG. 6). Incidentally, porous bearings 156 do not have to be provided in chuck unit 153 in the case there is no risk of chuck unit 153 coming into contact with wafer W.

Here, the gas supplied to chuck member 124 is clean air (for example, compressed air), in which at least the temperature is adjusted to a constant level, and dust, particles and the like are removed. That is, wafer W suctioned by chuck member 124 is maintained at a predetermined temperature by the compressed air whose temperature is controlled. Further, the temperature, the degree of cleanliness and the like of the space where wafer stage WST and the like are placed can be maintained to a set range.

To both of the ends in the X-axis direction on the upper surface of chuck unit 153, one end of each of a pair of support plates 151 extending in the X-axis direction within a horizontal plane (XY plane) is connected, as is shown in FIG. 4.

To the upper surface of each of the pair of extended sections 159 of frame FL previously described, as is shown in FIG. 4, Z voice coil motor 144 and weight-cancelling device 131 are fixed lined in the X-axis direction. In this case, while weight-cancelling device 131 is placed at the inner side of Z voice coil motor 144, the arrangement is not limited to this.

And, the other end of each of the pair of support plates 151 is supported from below by weight-cancelling device 131 and Z voice coil motor 144, which are fixed to the upper surface of each of the pair of extended sections 159.

Each of the pair of Z voice coil motors 144 drives chuck unit 153 in the vertical direction with predetermined strokes (in a range including a first position where chuck unit 153 begins suction of wafer W, and a second position where wafer W suctioned by chuck unit 153 is mounted on the wafer holder (wafer table WTB)). Each of the pair of Z voice coil motors 144 is controlled by main controller 20 (refer to FIG. 6).

Each of the pair of weight-cancelling devices 131 is equipped with a piston member 133a and a cylinder 133b at which piston member 133a is provided freely slidable. The pressure of the space inside cylinder 133b, which is divided by the piston of piston member 133a and cylinder 133b, is set to a value according to the self-weight of chuck unit 153. The upper end of the rod section of piston member 133a is joined to the lower surface of support plate 151. Each of the pair of weight-cancelling devices 131 is a type of pneumatic spring device which gives a force in an upward direction (+Z direction) to support plate 151 via piston member 133a, and this force allows the pair of weight-cancelling devices 131 to support all or a part of the self-weight of chuck unit 153 (and support plate 151). The pressure, amount and the like of the pressurized gas supplied to the inside of cylinder 133b of weight-cancelling device 131 are controlled by main controller 20 (refer to FIG. 6). Here, because weight-cancelling device 131 is equipped with piston member 133a which moves in the vertical direction along cylinder 133b, weight-cancelling device 131 also functions as a guide upon vertical movement of chuck unit 153a.

Each of the pair of wafer support members 125 is equipped with a vertical movement rotation driving section 127 attached integrally via a coupling member which is not shown to each of the pair of extended sections 159 of frame FL, a drive shaft 126 which is driven in the Z-axis direction (vertical direction) and the θz direction by vertical movement rotation driving section 127, and a support plate 128, which has one end of its upper surface in the longitudinal direction fixed to the lower end surface of drive shaft 126, extending in an uniaxial direction within the XY plane. Support plate 128 is driven by vertical movement rotation driving section 127, so that the other end in the longitudinal direction is rotationally driven in the θz direction with drive shaft 126 serving as the rotation center between a first support plate position opposing a part of the outer circumference section of chuck unit 153 and a second support plate position which does not face chuck unit 153, and is also driven in predetermined strokes in the vertical direction. A suction pad 128*b* is fixed to the upper surface of support plate 128, near the other end. Suction pad 128*b* is joined to a vacuum device via a piping member which is not shown (the vacuum device and the piping member are each omitted in the drawings). Wafer W, when supported from below by support plate 128 (suction pad 128*b*), is vacuum chucked and held by suction pad 128*b*. That is, a frictional force between wafer W and suction pad 128*b* limits movement of wafer W in the X-axis direction, the Y-axis direction, and the θz direction. Incidentally, the frictional force between wafer W and wafer support member 125 can be used, without suction pad 128*b* being provided.

The first support plate position of each of the support plates 128 is set so that support plate 128 of one of wafer support members 125, when at the first support plate position, faces the outer circumference edge in the five o'clock direction when viewed from the center of plate member 44 of chuck unit 153, and support plate 128 of the other wafer support member 125, when at the first support plate position, faces the outer circumference edge in the seven o'clock direction when viewed from the center of plate member 44 of chuck unit 153 (refer to FIG. 3). To the upper surface of each of the support plates 128, a reflection mirror 128*a* is fixed, on the drive shaft 126 side of suction pad 128*b*.

A pair of measurement systems 123*a*, 123*b*, which employs a vertical illumination method where an illumination light can be irradiated from above to each of the reflection mirrors 128*a* on each of the support plates 128 when each of the pair of support plates 128 is at the first support plate position, is provided near the pair of wafer support members 125. Each of the pair of measurement systems 123*a*, 123*b* is joined to mainframe BD, via a support member which is not shown.

Each of the pair of measurement systems 123*a*, 123*b* is an edge position detection system which employs an image processing method to detect position information of the edge section of wafer W, the system including an illumination light source, a plurality of optical path bending members such as reflection mirrors, lenses or the like, imaging devices such as CCDs and the like.

In carry-in unit 121, another reflection mirror 34 is further provided (refer to FIG. 3) at a position of a predetermined height facing the outer circumference edge in a six o'clock direction when viewed from the center of plate member 44 of chuck unit 153 (at a position which can face the notch of wafer W when wafer W is suctioned by chuck unit 153). A measurement system 123*c* (refer to FIG. 6) is provided, which employs a vertical illumination method in which an illumination light can be irradiated from above with respect to reflection mirror 34. Measurement system 123*c* is structured in a similar manner as measurement systems 123*a*, 123*b*.

When edge detection of wafer W is performed by each of the three measurement systems 123*a* to 123*c*, imaging signals are to be sent to a signal processing system 116 (refer to FIG. 6).

Carry-in unit 121 is furthermore equipped with a wafer flatness detection system 147 (refer to FIG. 6), and a plurality of chuck unit position detection systems 148 (refer to FIGS. 4 and 6).

Wafer flatness detection system 147 is structured by a plurality of, or in this case, four Z position detection systems 146 (refer to FIG. 4) which detects a position (Z position) in the Z-axis direction of the wafer W surface at a plurality of places of mainframe BD each placed at, for example, three places above wafer W near the outer circumference section, and one place above the wafer near the center section vicinity. In the present embodiment, as Z position detection system 146, a position detection system employing a triangulation method which is a type of a so-called optical displacement meter is used, which receives a reflected light of a measurement beam irradiated on a target object and detects the position (the Z position in the present embodiment) of the target object. In the present embodiment, at each Z position detection system 146, a measurement beam is irradiated on the wafer W upper surface via through hole 152 (refer to FIG. 5) previously described, and receives the reflected light via another through hole 152.

Measurement values of the plurality of Z position detection systems 146 structuring wafer flatness detection system 147 are sent to main controller 20 (refer to FIG. 6). Main controller 20, based on the measurement values of the plurality of Z position detection systems 146, detects the Z position at the plurality of places on the wafer W upper surface, and obtains the flatness of wafer W from the detection results.

A plurality of (for example, three) chuck unit position detection systems 148 is fixed to mainframe BD. As each of the chuck unit position detection systems 148, a position detection system of a triangulation method similar to Z position detection system 146 is used. By the three chuck unit position detection systems 148, the Z position of the plurality of places on the upper surface of chuck unit 153 is detected, and the detection results are sent to main controller 20 (refer to FIG. 6).

Although it is not shown in FIG. 1, above reticle R, a pair of reticle alignment system detection systems 14 (refer to FIG. 6) is placed, which employs a TTR (Through The Reticle) method using an exposure wavelength to simultaneously observe a pair of reticle alignment marks on reticle R and an image via projection optical system PL of the pair of the second reference marks RM on measurement plate 30 on wafer table WTB corresponding to the reticle alignment marks. Detection signals of the pair of reticle alignment system detection systems 14 are supplied to main controller 20.

Other than this, in exposure apparatus 100, near projection optical system PL, an irradiation system which irradiates a plurality of measurement beams on the surface of wafer W via liquid Lq of liquid immersion area 36, and a multi-point focal point detection system 54 (refer to FIG. 6) (hereinafter referred to as a multi-point AF system) consisting of a light-receiving system which receives the reflection beams of each measurement beam via liquid Lq are provided. As such a multi-point AF system 54, a multi-point focal point detection system having a structure, in which an irradiation system and a light-receiving system each include a prism and both use the tip lens of projection optical system PL as their constituent element, as is disclosed in, for example, U.S. Patent Application Publication No. 2007/0064212, can be used.

FIG. 6 is a block diagram showing an input/output relation of main controller 20, which mainly structures a control system of exposure apparatus 100 and has overall control of each section. Main controller 20 includes a workstation (or a microcomputer) or the like, and has overall control of each section structuring exposure apparatus 100.

In exposure apparatus 100 related to the present embodiment structured in the manner described above, under the control of main controller 20, similarly to the exposure apparatus disclosed in, for example, U.S. Pat. No. 80,544,472 and the like, a parallel processing operation is performed using wafer stage WST and measurement stage MST. In exposure apparatus 100 of the present embodiment, on wafer W loaded (carry-in) on wafer stage WST as it will be described later on and held by wafer table WTB, liquid immersion area 36 is formed using local liquid immersion device 8, and exposure operation of the wafer is performed using illumination light IL, via projection optical system PL and liquid Lq of liquid immersion area 36. This exposure operation is performed by repeating a moving operation between shots, in which wafer stage WST is moved to a scanning starting position (acceleration starting position) for exposure of each shot area on wafer W, and a scanning exposure operation, in which the pattern of reticle R is transferred by the scanning exposure method onto each shot area, based on results of wafer alignment (EGA) by alignment systems AL1, and $AL2_1$ to $AL2_4$ of alignment system device 99, the latest base line of alignment system AL1, and $AL2_1$ to $AL2_4$ and the like, performed in advance by the main controller. Further, on the parallel processing operation described above, the liquid immersion area is to be held on measurement stage MST during wafer exchange, and when wafer stage WST is placed right under projection unit PU on the exchange with measurement stage, the liquid immersion area on measurement stage MST is moved onto wafer stage WST.

However, in the present embodiment, different from the exposure apparatus disclosed in, U.S. Pat. No. 8,054,472 described above, position information of wafer stage WST and position information of measurement stage MST are measured using each interferometer of interferometer system 70, during the parallel processing operation using wafer stage WST and measurement stage MST. Further, reticle alignment is performed, using the pair of reticle alignment system detection systems 14 (refer to FIG. 6), measurement plate 30 on wafer stage WST (refer to FIG. 2A), and the like. Furthermore, control in the Z-axis direction of wafer table WTB during exposure is performed in a real-time manner using multi-point AF system 54 previously described.

Incidentally, as is with the exposure apparatus disclosed in, U.S. Pat. No. 8,054,472 described above, a multi-point AF system consisting of an irradiation system and a light-receiving system can be placed in between alignment system device 99 and projection unit PU, instead of multi-point AF system 54. And, the Z position of the entire surface of wafer W can be acquired using the multi-point AF system while wafer stage WST is moving on wafer alignment, and position control in the Z-axis direction of wafer stage WST during exposure can be performed, based on the Z position of the entire surface of wafer W acquired during the alignment. In this case, another measurement device has to be provided for measuring the Z position of the wafer table WTB upper surface on wafer alignment and on exposure.

Next, a procedure for loading wafer W will be described based on FIGS. 7A to 9B. Incidentally, in FIGS. 7A to 9B, to simplify the drawings and to prevent complication of the drawings, wafer stage WST, wafer flatness detection system 147 and chuck unit position detection system 148 and the like are omitted, except for mainframe BD, vertical movement pin 140 and the like.

Figure 7A:
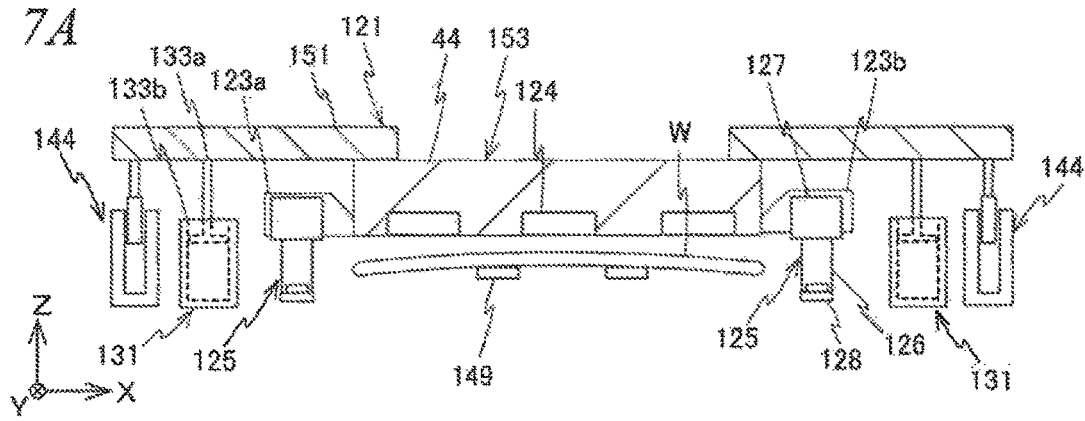
FIG. 7A is a view (No. 1) used to explain a carry-in operation of a wafer.

As a premise, for example, chuck unit 153, as is shown in FIG. 7A, is moved near a movement upper limit position (movement limit position at the +Z side) within the stroke range by the pair of Z voice coil motors 144, or in other words, moved to the first position previously described, and is maintained at the position. Further, at this point, the pair of wafer support members 125 is to have each of their support plates 128 set to the second support plate position by main controller 20.

In this state, first of all, carry-in of wafer W to an area below chuck unit 153 is performed, in a state where wafer W is supported from below by carrier arm 149. Here, carry-in of wafer W to loading position LP by carrier arm 149 can be performed when exposure processing on a previous wafer subject to exposure (hereinafter called a previous wafer) is being performed on wafer stage WST, or when alignment processing or the like is being performed.

Figure 7B:
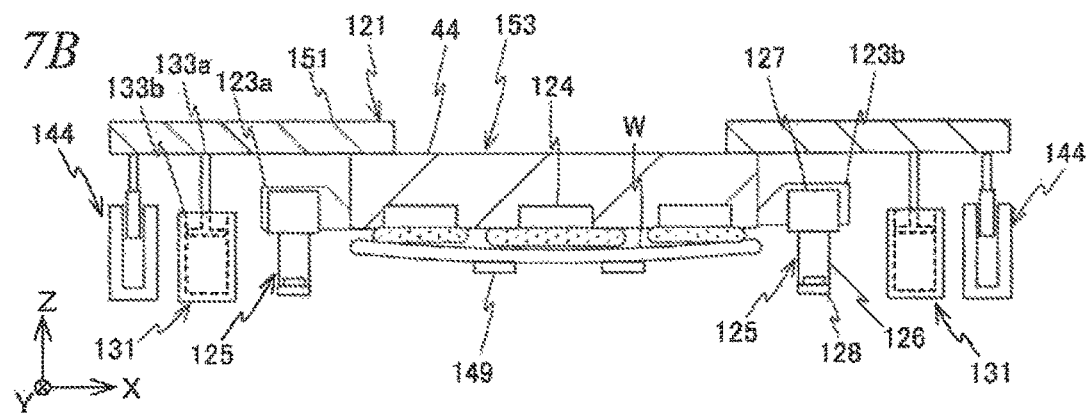
FIG. 7B is a view (No. 2) used to explain a carry-in operation of a wafer.

Next, as is shown in FIG. 7B, main controller 20 begins to supply fluid (air) to the plurality of chuck members 124, and then by driving carrier arm 149 slightly upward (or by driving chuck unit 153 slightly downward), wafer W is suctioned by chuck unit 153 (chuck member 124) in a non-contact manner while maintaining a predetermined distance (gap). Incidentally, in FIG. 7B, to simplify the description, wafer W is to be suctioned by chuck unit 153 by a flow of air blown out indicated by blackened dots in the drawing (to be more precise, by a negative pressure caused by the flow). The same applies to each drawing in FIGS. 7C to 9A. However, the state of the air actually blown out is not necessarily limited to this.

Figure 7C:
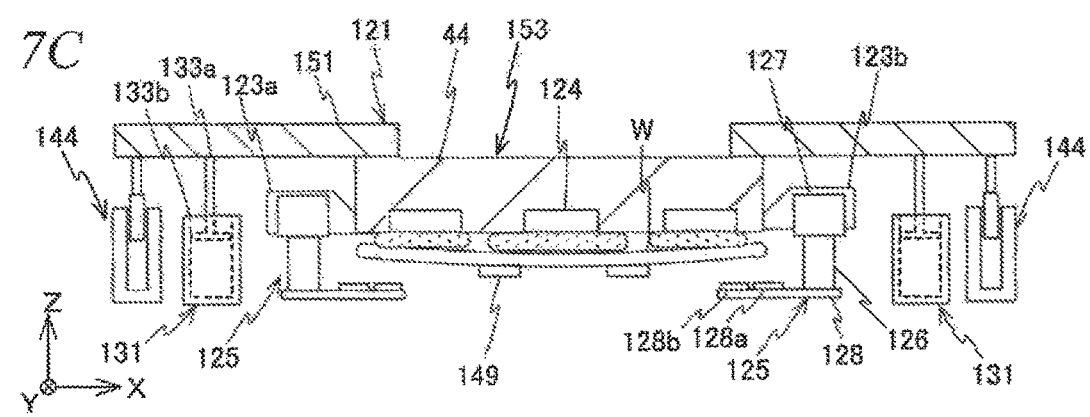
FIG. 7C is a view (No. 3) used to explain a carry-in operation of a wafer.

Next, main controller 20 drives (rotates) support plates 128 of the pair of wafer support members 125 so as to position each support plate at its first support plate position, via vertical movement rotation driving section 127. On this operation, as is shown in FIG. 7C, by vertical movement rotation driving section 127 of the pair of wafer support members 125, suction pads 128b on the upper surface of each of the support plates 128 are moved to positions facing the lower surface (rear surface) of wafer W. Further, in the state where the support plates 128 of the pair of wafer support member 125 are positioned at each of their first support plate positions, reflection mirrors 128a are each facing predetermined positions at the outer circumference edge on the rear surface of wafer W. Further, at the notch position on the rear surface of wafer W, another reflection mirror 34 faces the notch position at the stage when wafer W is suctioned by chuck unit 153.

Figure 7D:
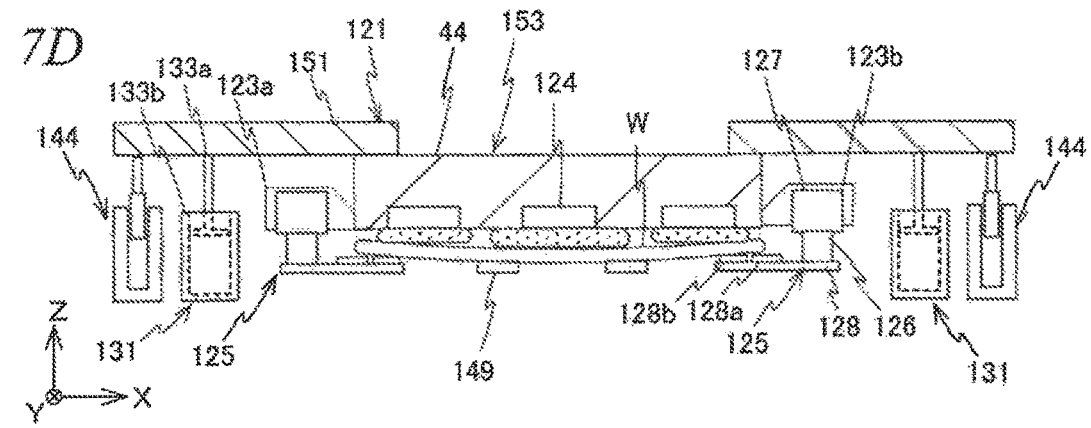
FIG. 7D is a view (No. 4) used to explain a carry-in operation of a wafer.

When suction pads 128b on the upper surface of each of the support plates 128 face wafer W, main controller 20, as is shown in FIG. 7D, controls vertical movement rotation driving section 127 so as to drive support plate 128 upward. And when suction pads 128b on the upper surface of each of the support plates 128 and the lower surface of wafer W come into contact, main controller 20 begins vacuum suction by the pair of suction pads 128b, and supports the lower surface of wafer W by suction by each of the suction pads 128b. On this operation, movement of wafer W is restricted in directions of three degrees of freedom, which are the Z direction, the θx direction, and the θy direction, by the suction from above by chuck unit 153, as well as in directions of three degrees of freedom, which are the X direction, the Y direction and the θz direction, by the suction support from below by the pair of support plates 128, which in turn restricts the movement in directions of six degrees of freedom.

The processing sequence of exposure apparatus 100 is decided so that wafer W waits above loading position LP in this state, that is, in a state where suction hold (support) is performed by chuck unit 153 and the pair of wafer support members 125. In exposure apparatus 100, while wafer W waits at loading position LP, exposure processing (and alignment processing prior to the exposure processing) or the like to the previous wafer held on wafer table WTB is performed. Further, on this operation, vacuum suction of wafer W by carrier arm 149 can be moved to a state where the suction is stopped.

Then, while wafer W is waiting above loading position LP, as is shown in FIG. 8A, the three measurement systems 123a to 123c (measurement system 123c is not shown. Refer to FIG. 6) each performs edge detection of wafer W. Imaging signals of the imaging elements that the three measurement systems 123a to 123c have are sent to signal processing system 116 (refer to FIG. 6). Signal processing system 116, by the method disclosed in, for example, U.S. Pat. No. 6,624,433 and the like, detects position information of the wafer, of the three places at the circumferential section including the notch, and obtains positional deviation in the X-axis direction and the Y-axis direction and rotational (θz rotation) error of wafer W. Then, information on the positional deviation and the rotation error is supplied to main controller 20 (refer to FIG. 6).

Around the beginning of the edge detection of wafer W described above, main controller 20 drives carrier arm 149 downward so as to separate carrier arm 149 and wafer W, and then makes carrier arm 149 withdraw from loading position LP.

When exposure processing of the previous wafer is completed, and the previous wafer is unloaded from wafer table WTB by the carry-out device which is not shown, by main controller 20, wafer stage WST is moved to a position below (loading position LP) chuck unit 153, via coarse movement stage driving system 51A. Then, as is shown in FIG. 8B, main controller 20 drives center support member 150 having the three vertical movement pins 140 upward, via driver 142. The edge detection of wafer W by the three measurement systems 123a to 123c is still being continued at this point of time, and main controller 20 finely drives wafer stage WST by the same amount in the same direction as the deviation amount (error) of wafer W, so that wafer W is mounted on a predetermined position on wafer stage WST, based on positional deviation and rotation error information of wafer W.

Then, when the upper surface of the three vertical movement pins 140 comes into contact with the lower surface of wafer W suctioned by chuck unit 153, main controller 20 stops the upward drive of center support member 150. This allows wafer W to be held by suction by the three vertical movement pins 140 in a state where the positional deviation and the rotation errors are corrected.

Here, the Z position of wafer W suctioned by chuck unit 153 at the waiting position can be accurately determined to some extent. Accordingly, by driving center support member 150 from the reference position by a predetermined amount, main controller 20 can make the three vertical movement pins 140 come into contact with the lower surface of wafer W suctioned by chuck unit 153, based on measurement results of displacement sensor 145. However, the arrangement is not limited to this, and an arrangement can be set in advance so that the three vertical movement pins 140 come into contact with the lower surface of wafer W suctioned by chuck unit 153 at the upper limit of the movement position of center support member 150 (the three vertical movement pins 140).

Then, main controller 20 operates a vacuum pump which is not shown, and begins vacuum suction to the wafer W lower surface by the three vertical movement pins 140. Incidentally, the suction of wafer W by chuck member 124 is being continued even in this state. By the suction by chuck member 124 and the frictional force due to the support from below of the three vertical movement pins 140, the movement of wafer W is restricted in directions of six degrees of freedom. Accordingly, no problems occur even when the suction hold of wafer W by support plate 128 of wafer support member 125 is released in this state.

So, when wafer W is supported (held by suction) by the three vertical movement pins 140, main controller 20 separates support plates 128 of the pair of wafer support members 125 from wafer W by driving the support plates downward, after finishing vacuum suction by the pair of suction pads 128b, as is shown in FIG. 8C. Then, each of the support plates 128 is set to the second support plate position, via vertical movement rotation driving section 127.

Next, as is shown in FIG. 8D, main controller 20 drives each of the chuck units 153 and the three vertical movement pins 140 (center support member 150) downward that suctions and support wafer W, via the pair of Z voice coil motors 144 and driver 142. By this operation, a downward drive of chuck unit 153 and the three vertical movement pins 140 (center support member 150) begins, while the suction state by chuck unit 153 (chuck member 124) and the support state by the three vertical movement pins 140 with respect to wafer W are maintained. Here, the drive of chuck unit 153 is performed by main controller 20 driving the pair of Z voice coil motors 144, based on detection results of the plurality of chuck unit position detection systems 148.

Figure 9A:
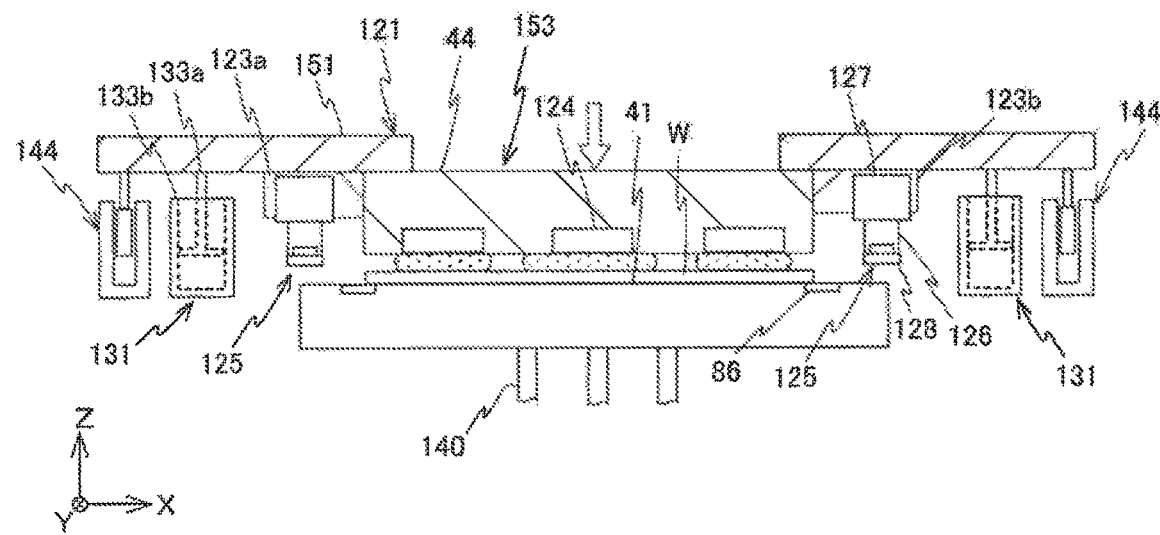
FIG. 9A is a view (No. 9) used to explain a carry-in operation of a wafer.

The drive of chuck unit 153 with the three vertical movement pins 140 (center support member 150) described above is performed until the lower surface (rear surface) of wafer W comes into contact with a planar wafer mounting surface 41 of wafer table WTB (refer to FIG. 9A). Here, although wafer mounting surface 41 is actually a virtual flat surface (area) formed by upper end surfaces of multiple pins that the pin chuck provided on wafer table WTB is equipped with, in FIG. 9A and the like, the upper surface of wafer table WTB is indicated as wafer mounting surface 41.

Before starting the downward drive and during the downward drive of chuck unit 153 with the three vertical movement pins 140 (center support member 150) described above, main controller 20 measures the flatness of the wafer W upper surface, via wafer flatness detection system 147 (a plurality of Z position detection systems 146 (refer to FIG. 4)). And, of chuck unit 153 and center support member 150, main controller 20 controls the downward speed of one of the members (in this case, center support member 150) superior in responsiveness with respect to the downward speed of the other member (in this case, chuck unit 153), based on the measurement results of wafer flatness detection system 147, so that the flatness of wafer W falls within a desired range.

That is, for example, in the case it is detected by wafer flatness detection system 147 that wafer W is deformed in a shape protruding downward (a shape in which the inner circumference section is recessed than the outer circumference section), main controller 20 deceases the downward speed of center support member 150 so that it becomes slower than the driving speed of chuck unit 153, via driver 142. When the downward speed of center support member 150 is made slower than the driving speed of chuck unit 153, the center of the lower surface of wafer W is substantially pushed from below by the three vertical movement pins 140. Then, when the flatness of wafer W becomes a predetermined value, main controller 20 further drives center support member 150 and chuck unit 153 downward at the same speed (synchronously). In this case, the flatness of wafer W "becomes a predetermined value" means that, for example, wafer W is not completely flat and although the inner circumference section is recessed when compared to the outer circumference section, the shape of the wafer is deformed so that the recess level becomes equal to or less than a level determined in advance.

Further, for example, in the case it is detected by wafer flatness detection system 147 that wafer W is deformed in shape protruding upward (a shape in which the inner circumference section is protruding upward than the outer circumference section), main controller 20 increases the downward speed of center support member 150 so that it becomes faster than the driving speed of chuck unit 153, via driver 142. When the downward speed of center support member 150 is made faster than the driving speed of chuck unit 153, the center of the lower surface of wafer W is substantially pulled downward since the wafer is held by suction by the three vertical movement pins 140. Then, when the flatness of wafer W becomes the predetermined value described above chuck unit 153, main controller 20 drives center support member 150 and chuck unit further downward at the same speed (synchronously).

Incidentally, in the present embodiment, while the position in the Z direction of wafer W is detected at a plurality of points of wafer W, and information related to the shape (flatness) of wafer W is obtained from the information related to these positions, other methods can also be used. For example, an image of wafer W can be picked up by a camera or the like, and the information related to the shape (flatness) of wafer W can be obtained from the image information which has been obtained.

In the present embodiment, main controller 20 constantly measures the deformation state (flatness) of wafer W using wafer flatness detection system 147, from the state in which wafer W is suctioned by chuck unit 153 from an upward direction and is also supported from below by vertical movement pins 140 to the state in which wafer W is held by suction on the wafer holder which is not shown. Therefore, even in the case excessive flatness correction was performed, such as when, for example, wafer W located between chuck unit 153 and the three vertical movement pins 140 has a shape protruding downward and the descending speed of vertical movement pins 140 was made slower than the descending speed of chuck unit 153 so as to adjust the flatness, and as a consequence, wafer W became a shape protruding upward, by increasing the descending speed of vertical movement pins 140 with respect to the descending speed of chuck unit 153, the flatness of wafer W can be adjusted again to a predetermined value. However, measurement of the deformation state (flatness) of wafer W can also be performed only during a part of a time interval, the interval being from a state where wafer W is suctioned from an upward direction by chuck unit 153 and is also supported from a downward direction by vertical movement pins 140 until wafer W is held by suction on the wafer holder which is not shown (for example, just before coming into contact with wafer mounting surface 41).

Then, when the lower surface of wafer W comes into contact with the wafer table WTB upper surface (wafer mounting surface 41) as is shown in FIG. 9A, main controller 20 stops the high-pressure airflow flowing out from all of the chuck members 124, via adjustment device 115, cancels the suction of wafer W by all of the chuck units 153, and begins the adsorption (suction) of wafer W by the wafer holder which is not shown on wafer table WTB.

Figure 9B:
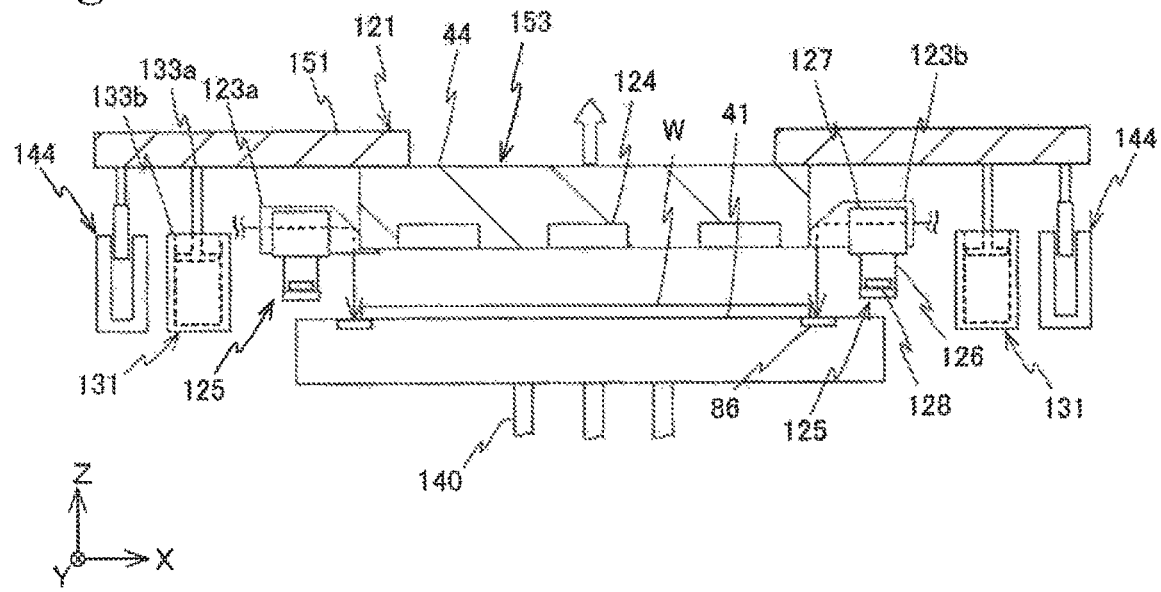
FIG. 9B is a view (No. 10) used to explain a carry-in operation of a wafer.

Next, as is shown in FIG. 9B, main controller 20 moves chuck unit 153 upward to a predetermined waiting position (the first position or a position near the first position), via the pair of Z voice coil motors 144. This completes the loading (carry-in) of wafer W onto wafer table WTB.

Here, when chuck unit 153 is driven upward and stopped (or during the upward drive), main controller 20 performs detection of edge position of wafer W, using the three measurement systems 123a to 123c previously described. In this case, edge detection of wafer W is performed by measurement beams from measurement systems 123a, 123b, 123c being irradiated on the three reflection mirrors 86 on wafer table WTB, and reflection beams from the reflection mirrors being received by the imaging elements of measurement system 123a, 123b, 123c. Imaging signals of the imaging elements that the three measurement systems 123a to 123c have are sent to signal processing system 116 (refer to FIG. 6), and information on positional deviation and rotation errors of wafer W is supplied to main controller 20. Main controller 20 stores the information on positional deviation and rotation errors in a memory as an offset amount, and on wafer alignment, on exposure or the like to be described later on, controls the position of wafer table WTB, taking into account the offset amount described above. Incidentally, because wafer W is mounted on wafer table WTB after being supported by the three vertical movement pins 140, in a state where edge detection of wafer W is performed during the waiting previously described, and positional deviation and rotation errors obtained as a result are corrected, edge detection of wafer W after wafer W being loaded on wafer table WTB does not necessary have to be performed.

As is described so far, according to carrier system 120 related to the present embodiment exposure apparatus 100 equipped with the system, on loading wafer W onto wafer table WTB, main controller 20 can independently and vertically move chuck unit 153 which suctions wafer W from above and vertical movement pins 140 (center support member 150) which support wafer W from below. That is, on making wafer W, in which flexure, distortion or the like has occurred, move downward for wafer stage WST to hold by suction, wafer W can be loaded on wafer stage WST in a state where the flatness of wafer W is maintained to a value within a desired range, by controlling the descending speed of center support member 150 (the three vertical movement pins 140).

Further, in the present embodiment, while a structure was employed where three vertical movement pins 140 (center support member 150), which were structured to vertically move in an integral manner, were used, the structure is not limited to this. For example, center support member 150 can be structured so that the three vertical movement pins move vertically in an independent manner, and the flatness of wafer W can be made to fall within a desired range by making the three vertical movement pins move vertically in an independent manner, based on measurement results of the flatness of the wafer. Incidentally, the number of vertical movement pins is not limited to three, and the pins can be equal to, less than or more than three.

Further, in carry-in unit 121 which structures a part of carrier system 120 related to the present embodiment, because the self-weight of chuck unit 153 is supported by the pair of weight-cancelling devices 131, the force when driving chuck unit 153 in the vertical direction can be reduced, and the size of the pair of Z voice coil motors 144 can be reduced.

Further, in carrier system 120 related to the present embodiment, during the loading of wafer W onto wafer stage WST, main controller 20 measures positional deviation and rotation deviation of wafer W via measurement systems 123a to 123c, and based on the measurement results, wafer stage WST is driven so that positional deviation and rotational deviation of wafer W are corrected. Accordingly, wafer W can be loaded on wafer table WTB with good positional reproducibility.

Further, according to exposure apparatus 100 related to the present embodiment, because exposure to wafer W loaded on wafer table WTB in a state of high flatness and with good positional reproducibility is performed in a step-and-scan method, to each of a plurality of shot areas on wafer W, exposure with good overlay accuracy and without defocus becomes possible, the pattern of reticle R can be transferred on the plurality of shot areas in a favorable manner.

Incidentally, in the embodiment above, considering the point that the three vertical movement pins 140 (center support member 150) are superior to chuck unit 153 in responsiveness at the time of driving, driver 142 was driven so as to adjust the descending speed of the three vertical movement pins 140 (center support member 150) to make the flatness of wafer W become a value within a desired range, when wafer W is loaded on wafer stage WST. However, on the contrary, in the case chuck unit 153 is superior to the three vertical movement pins 140 (center support member 150) in responsiveness at the time of driving, it is desirable to adjust the descending speed of chuck unit 153. In the case responsiveness at the time of driving is about the same in the three vertical movement pins 140 (center support member 150) and chuck unit 153, the descending speed of one of center support member 150 and chuck unit 153, or both center support member 150 and chuck unit 153 can be adjusted. Further, since the flatness of the wafer only has to be maintained at a predetermined level, the descending speed of one of center support member 150 and chuck unit 153, or both center support member 150 and chuck unit 153 can be adjusted, regardless of the superiority of responsiveness.

Figure 10:
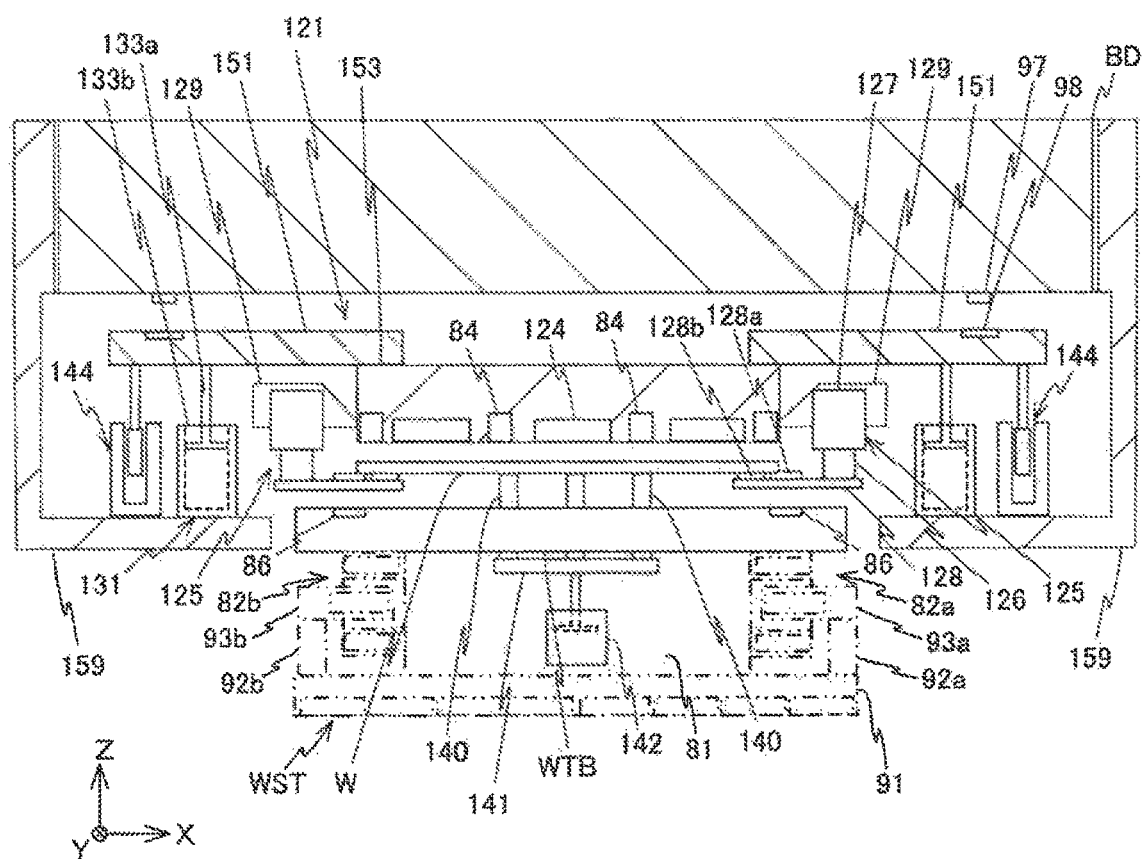
FIG. 10 is a view used to explain an example (a modified example) of a structure of a wafer flatness detection system and a chuck unit position detection system.

Further, in the embodiment above, while the case has been described where wafer flatness detection system 147 was structured by the plurality of Z position detection systems 146, the embodiment is not limited to this, and the wafer flatness detection system can be structured using a detection device that irradiates light on the entire upper surface of the wafer and can detect the surface shape. Further, in the case the wafer flatness detection system is structured by the plurality of Z position detection systems similarly to the embodiment described above, as the Z position detection system, the position detection system which employs a triangulation method does not necessarily have to be used. That is, since the wafer flatness detection system only has to be able to detect the flatness (the Z position of a plurality of places) of wafer W, for example, as is shown in FIG. 10, instead of Z position detection system 146 previously described, a plurality of capacitance sensors 84 can be placed at the lower surface of chuck unit 153. Because a sensor having a size smaller than Z position detection system 146 can be used for capacitance sensor 84, capacitance sensor 84 can be placed at places more than the total of four places where the measurement points of the plurality of Z position detection systems 146 were placed, which are, for example, three places at the outer circumference section and one place at the center.

Further, because the chuck unit position detection system only has to measure the Z position of chuck unit 153, the system is not limited to a position detection system of the triangulation method, and as is shown in FIG. 10, for example, the chuck unit position detection system can be structured using an encoder system made up of an encoder head 97 and a scale 98. Or, for example, in at least one of the pair of Z voice coil motors 144, an encoder can be provided, in which the encoder measures the displacement amount in the Z-axis direction from a reference point of a mover corresponding to its stator, and the chuck unit position detection system can be structured by the encoder. Further, chuck unit position detection system 148 can be structured using the capacitance sensor.

Figure 11:
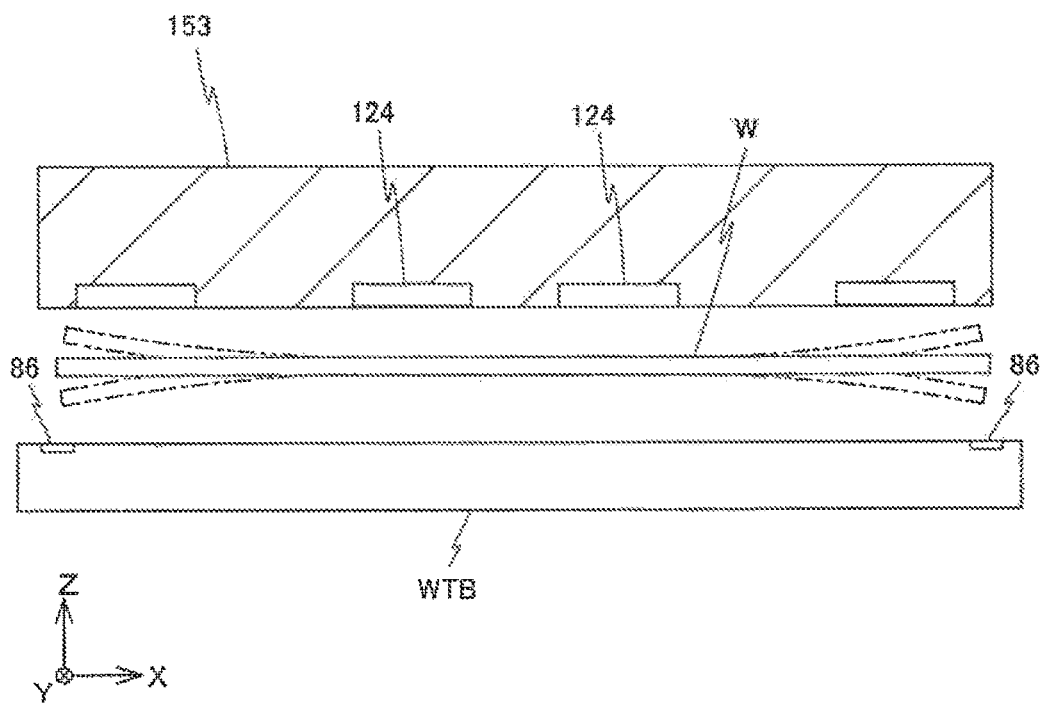
FIG. 11 is a view used to explain an example of an operation immediately before the wafer is mounted on the wafer stage, of the wafer carry-in operation.

Incidentally, in the embodiment described above, just before wafer W is loaded onto wafer table WTB, gas can be blown out from chuck member 124 toward wafer W at a blowout velocity faster than the blowout velocity so far when wafer W was being suctioned. By this operation, as is shown in FIG. 11, the pressure between wafer W and chuck member 124 increases, and the outer circumference section of wafer W vibrates (a so-called pneumatic hammer phenomenon occurs). When wafer W is moved further downward in a state where this vibration is occurring, wafer W is mounted on wafer table WTB in a state where a contact area between the outer circumference section at the lower surface of wafer W and the wafer holder upper surface which is not shown is small. That is, because the frictional force between the wafer W lower surface and the wafer holder which is not shown is reduced, on suction hold of wafer W by the wafer holder which is not shown, wafer W is mounted on wafer table WTB in a state where generation of distortion caused by adsorption is suppressed.

Incidentally, in the embodiment described above, while wafer W is mounted on wafer mounting surface 41 of wafer table WTB by chuck unit 153 performing suction of wafer W from above, and chuck unit 153 and the three vertical movement pins 140 being driven downward in a state where the three vertical movement pins 140 perform vacuum suction of the rear surface of wafer W, the structure is not limited to this. For example, instead of the three vertical movement pins 140, a structure that uses carrier arm 149 can be employed. In this case, carrier arm 149 is to have a structure drivable within a predetermined range also in the vertical direction, in addition to the horizontal direction. And, in a state where vacuum suction of the rear surface of wafer W is performed by carrier arm 149, the wafer W surface is suctioned by chuck unit 153, and main controller 20 sets each of the downward speed of chuck unit 153 and carrier arm 149 to a predetermined value, using the detection results of wafer flatness detection system 147.

Incidentally, it is preferable to form a groove in wafer mounting surface 41 so as to fit carrier arm 149 therein so that carrier arm 149 does not interfere with wafer W when wafer W is mounted on wafer mounting surface 41, and that wafer W and wafer mounting surface 41 can come into contact with good precision. Then, carrier arm 149 can be made to move in the horizontal direction inside the groove, so that it can be withdrawn from wafer mounting surface 41.

Further, as another structure, wafer W can be mounted on wafer mounting surface 41 of wafer table WTB without using the three vertical movement pins 140, after wafer W is delivered to chuck unit 153 from carrier arm 149. In this case, for example, main controller 20 can control the descending speed of chuck unit 153, the flow velocity (flow amount) of the fluid blowing out from chuck member 124, and the direction of the fluid flowing, using the detection results of wafer flatness detection system 147 to preferably set each of the suction forces of chuck unit 153 to a predetermined value. On this operation, in the case the rear surface of wafer W is supported by suction using suction pad 125b of wafer support member 125, similarly to the case of carrier arm 149 previously described, a cutout into which wafer support member 125 fits is preferably formed in wafer mounting surface 41, so that wafer W and mounting surface 41 can come into contact with good precision. Further, in the case movement of wafer W in the lateral direction (a direction parallel to the mounting surface) does not have to be restricted, a structure can be employed in which wafer W is held by suction only by chuck member 124 without wafer support member 125 being provided, and wafer W is mounted on wafer mounting surface 41 of wafer table WTB. Also on this operation, for example, main controller 20 can control the descending speed of chuck unit 153, the flow velocity (flow amount) of the fluid blowing out from chuck member 124, and the direction of the fluid flowing, using the detection results of wafer flatness detection system 147 to preferably set each of the suction forces of chuck unit 153 to a predetermined value.

Incidentally, in the embodiment described above, as an example, while a liquid immersion exposure apparatus was described in which a liquid immersion space including an optical path of the illumination light was formed between the projection optical system and the wafer, and the wafer was exposed with the illumination light via the liquid between the projection optical system and the liquid immersion space, the embodiment is not limited to this, and the embodiment described above can be applied to a dry-type exposure apparatus which performs exposure of wafer W without the illumination light passing through the liquid (water).

Further, in the embodiment described above and its modified example (hereinafter referred to as the embodiment described above and the like), while the case has been described where the exposure apparatus is a scanning type exposure apparatus of the step-and-scan method or the like, the embodiment is not limited to this, and the embodiment described above can also be applied to a stationary type exposure apparatus such as a stepper. Further, the embodiment described above and the like can also be applied to a reduction projection exposure apparatus of the step-and-stitch method in which a shot area and a shot area are synthesized, an exposure apparatus of the proximity method, a mirror projection aligner or the like. Furthermore, the embodiment described above and the like can also be applied to a multi-stage type exposure apparatus equipped with a plurality of wafer stages, as is disclosed in, for example, U.S. Pat. Nos. 6,590,634, 5,969,441, 6,208,407 or the like.

Further, the projection optical system in the exposure apparatus of the embodiment described above and the like is not limited to a reduction system, and can either be an equal-magnifying or a magnifying system, and projection optical system PL is not limited to a refractive system, and can either be a reflection system or a catadioptric system, and its projection image can either be an inverted image or an erect image. Further, while the shape of the illumination area and the exposure area previously described was a rectangular shape, the embodiments are not limited to this, and for example, the shape can be an arc, a trapezoid, a parallelogram or the like.

Further, the light source of the exposure apparatus related to the embodiment described above and the like is not limited to the ArF excimer laser, and a pulse laser light source such as a KrF excimer laser (output wavelength 248 nm), an $F_2$ laser (output wavelength 157 nm), an $Ar_2$ laser (output wavelength 126 nm), or a $Kr_2$ laser (output wavelength 146 nm), a super high pressure mercury lamp which generates a bright line such as a g-line (wavelength 436 nm), an i-line (wavelength 365 nm), or the like can also be used. Further, a harmonic wave generating device which uses a YAG laser can also be used. As other light sources, as is disclosed in, for example, U.S. Pat. No. 7,023,610, a harmonic wave can also be used as vacuum ultraviolet light, in which a single-wavelength laser beam in the infrared range or the visible range emitted by a DFB semiconductor laser or a fiber laser is amplified by a fiber amplifier doped with, for example, erbium (or both erbium and ytterbium) and wavelength conversion into ultraviolet light is performed using a nonlinear optical crystal.

Further, in the embodiment described above and the like, as illumination light IL of the exposure apparatus, the light is not limited to light having a wavelength of 100 nm or more, and as a matter of course, light having a wavelength less than 100 nm can also be used. For example, the embodiment described above and the like can suitably be applied to an EUV exposure apparatus which uses EUV (Extreme Ultraviolet) light in the soft X-ray region (for example, a wavelength region of 5 to 15 nm). Other than this, the embodiment described above and the like can also be applied to an exposure apparatus which uses a charged particle beam such as an electron beam or an ion beam.

Furthermore, the embodiment described above and the like can also be applied to an exposure apparatus which synthesizes two reticle patterns on a wafer via the projection optical system and performs double exposure almost simultaneously on a shot area on the wafer by performing scanning exposure once, as is disclosed in, for example, U.S. Pat. No. 6,611,316.

Further, the object on which the pattern should be formed (the object subject to exposure on which the energy beam is irradiated) in the embodiment described above and the like is not limited to the wafer, and may be other objects such as a glass plate, a ceramic substrate, a film member, or a mask blank.

The usage of the exposure apparatus is not limited to the exposure apparatus for manufacturing semiconductors, and the embodiments above can be widely applied, for example, to an exposure apparatus for liquid crystals that transfers a liquid crystal display devices pattern onto a square-shaped glass plate, an exposure apparatus for manufacturing an organic EL, a thin film magnetic head, an imaging element (such as a CCD), a micromachine and a DNA chip or the like. Further, the embodiment described above and the like can also be applied to an exposure apparatus that transfers a circuit pattern onto a glass substrate or a silicon wafer for manufacturing a reticle or a mask that is used in not only microdevices such as semiconductor devices, but also used in an optical exposure apparatus, an EUV exposure apparatus, an X-ray exposure apparatus, an electron beam exposure apparatus or the like.

Electronic devices such as semiconductor devices are manufactured through the steps such as; a step for performing function/performance design of a device, a step for making a reticle based on this design step, a step for making a wafer from a silicon material, a lithography step for transferring a pattern of a mask (reticle) onto the wafer by the exposure apparatus (pattern generating device) and the exposure method related to the embodiment described above and the like, a development step for developing the wafer which has been exposed, an etching step for removing by the etching an exposed member of an area other than the area where the resist remains, a resist removing step for removing the resist that is no longer necessary since etching has been completed, a device assembly step (including a dicing process, a bonding process, and a package process), and an inspection step. In this case, in the lithography step, because the device pattern is formed on the wafer, using the exposure apparatus of the embodiment described above and the like and performing the exposure method previously described, a highly integrated device can be manufactured with good productivity.

Incidentally, the disclosures of all publications, PCT International Publications, U.S. Patent Application Publications and U.S. patents related to exposure apparatuses and the like that are cited in the description so far are each incorporated herein by reference.

The invention claimed is:

1. A carrier system that carries a plate-like object, the system comprising:
    a drive device that moves the object downward;
    a mounting section onto which the object moved downward by the drive device is placed; and
    a vibration imparting device that imparts vibration to the object moved downward by the drive device, wherein
    the vibration imparting device generates vibration at the object, and the object is moved downward in a state where the vibration is occurring to place the object onto the mounting section.

2. The carrier system according to claim 1, wherein a friction force between the object and the mounting section is reduced by generating the vibration at the object.

3. The carrier system according to claim 1, wherein a vibration of the object is caused by the vibration imparting device, and
    the object in the state where the vibration is occurring can be placed onto the mounting section in a state where a contact area between the object and an upper surface of the mounting section is small.

4. The carrier system according to claim 1, further comprising:
    an adsorption device that adsorbs and holds the object, wherein
    the vibration imparting device generates the vibration at the object before the adsorption device adsorbs and holds the object placed on the mounting section.

5. The carrier system according to claim 4, wherein distortion of the object at a time when the adsorption device adsorbs and holds the object is suppressed by generating the vibration at the object.

6. The carrier system according to claim 1, wherein the vibration of the object includes vibration of an outer periphery of the object.

7. The carrier system according to claim 1, wherein imparting of the vibration to the object is started before the object is placed onto the mounting section.

8. A carrier system that carries a plate-like object to a mounting section, the system comprising:
    a drive device that moves the object toward the mounting section;
    a vibration imparting device that imparts vibration to the object moved by the drive device; and
    an adsorption device that adsorbs and holds the object, wherein
    the vibration imparting device generates the vibration at the object before the adsorption device adsorbs and holds the object placed onto the mounting section.

9. The carrier system according to claim 8, wherein a friction force between the object and the mounting section is reduced by the vibration imparting device generating the vibration at the object.

10. The carrier system according to claim 8, wherein a vibration of the object is caused by the vibration imparting device, and
    the object in a state where the vibration is occurring can be placed onto the mounting section in a state where a contact area between the object and an upper surface of the mounting section is small.

11. The carrier system according to claim 8, wherein distortion of the object at a time when the adsorption device adsorbs and holds the object is suppressed by the vibration imparting device generating the vibration at the object.

12. The carrier system according to claim 8, wherein the vibration imparting device generates the vibration at an outer periphery of the object.

13. The carrier system according to claim 8, wherein the vibration imparting device starts to impart the vibration to the object before the object is placed onto the mounting section.

14. The carrier system according to claim 8, wherein the drive device places the object onto the mounting section by moving the object at which the vibration is being generated toward the mounting section after the vibration has been imparted to the object by the vibration imparting device.

15. The carrier system according to claim 8, wherein the vibration imparting device is movable toward the mounting section.

16. The carrier system according to claim 8, wherein the vibration imparting device includes a blowing section that blows a gas toward the object.

17. The carrier system according to claim 16, wherein the object can be suctioned and held by the gas blown by the blowing section and the vibration can be imparted to the object by the gas blown by the blowing section.

18. The carrier system according to claim 16, further comprising:
    a controller that controls a velocity of the gas blown by the gas blowing section, wherein
    the velocity of the gas blown by the gas blowing section when the vibration is imparted to the object is faster than when the object is suctioned and held.

19. The carrier system according to claim 8, wherein the vibration imparting device is movable toward the mounting section.

20. The carrier system according to claim 8, wherein the vibration imparting device is equipped in the drive device.

21. The carrier system according to claim 20, wherein the vibration imparting device is movable together with the object moved by the drive device.

22. The carrier system according to claim 21, wherein the vibration imparting device is provided above the object.

23. The carrier system according to claim 22, further comprising:

a support member that supports the object from below; and a contacting member that comes into contact with the object from below.

24. A carrier system that carries a plate-like object to a mounting section, the system comprising:

a drive device that moves the object toward the mounting section;

a vibration imparting device that imparts vibration to the object moved by the drive device; and an adsorption device that adsorbs and holds the object, wherein the object is vibrating when the object is placed onto the mounting section before the adsorption device adsorbs and holds the object placed onto the mounting section.

25. An exposure apparatus that forms a pattern on an object, the apparatus comprising:

the carrier system according to claim 1; and a pattern generating device that exposes the object carried onto the mounting section by the carrier system with an energy beam so as to form the pattern.

26. An exposure apparatus that forms a pattern on an object, the apparatus comprising:

the carrier system according to claim 8; and a pattern generating device that exposes the object carried onto the mounting section by the carrier system with an energy beam so as to form the pattern.

27. An exposure apparatus that forms a pattern on an object, the apparatus comprising:

the carrier system according to claim 24; and a pattern generating device that exposes the object carried onto the mounting section by the carrier system with an energy beam so as to form the pattern.

28. A carrying method of carrying a plate-like object, the method comprising:

moving the object downward; and placing the object that has been moved downward onto a mounting section, wherein in the placing, vibration is generated at the object by a vibration imparting device that imparts vibration to the object, and the object is moved downward in a state where the vibration is occurring to place the object onto the mounting section.

29. A carrying method of carrying a plate-like object to a mounting section, the method comprising:

moving the object toward the mounting section;

imparting vibration to the object that has been moved by a vibration imparting device that imparts vibration to the object; and adsorbing and holding the object by an adsorption device, wherein in the imparting the vibration, the vibration is generated at the object that is placed onto the mounting section before the object is adsorbed and held.

30. A carrying method of carrying a plate-like object to a mounting section, the method comprising:

moving the object toward the mounting section;

imparting vibration to the object that has been moved by a vibration imparting device that imparts vibration to the object; and adsorbing and holding the object by an adsorption device, wherein the object is vibrating when the object is placed onto the mounting section before the object is adsorbed and held.

* * * * *